United States Patent [19]
Aida et al.

[11] Patent Number: 5,245,690
[45] Date of Patent: Sep. 14, 1993

[54] OPTICAL FIBER AMPLIFIER INCLUDING RARE EARTH DOPED FIBER AND FEEDBACK PUMP LIGHT SOURCE CONTROL

[75] Inventors: Kazuo Aida, Yokohama; Hiroji Masuda, Yokosuka; Kiyoshi Nakagawa, Miuragun, all of Japan

[73] Assignee: Nippon Telegraph and Telephone Corporation, Tokyo, Japan

[21] Appl. No.: 892,945

[22] Filed: Jun. 3, 1992

[30] Foreign Application Priority Data

Jun. 3, 1991 [JP] Japan ................................. 3-131326

[51] Int. Cl.$^5$ ............................ G02B 6/00; H01J 3/30
[52] U.S. Cl. ...................................... 385/142; 385/12; 385/32; 385/123; 385/141; 372/6; 372/29; 372/69; 372/70; 359/341; 359/345
[58] Field of Search ................. 385/123, 12, 127, 128, 385/141, 142, 147; 372/6, 29, 69, 70, 96; 359/333, 341, 345; 250/227.11

[56] References Cited

U.S. PATENT DOCUMENTS

| | | | |
|---|---|---|---|
| 4,959,837 | 9/1990 | Fevrier et al. | 372/6 |
| 5,117,196 | 5/1992 | Epworth et al. | 372/31 X |
| 5,119,229 | 6/1992 | Grasso et al. | 372/6 X |
| 5,125,066 | 6/1992 | Ishiguro et al. | 385/142 |
| 5,138,621 | 8/1992 | Goto et al. | 372/6 |
| 5,159,601 | 10/1992 | Huber | 372/6 |
| 5,161,050 | 11/1992 | Grasso et al. | 372/6 X |
| 5,181,210 | 1/1993 | Chung et al. | 372/6 |

FOREIGN PATENT DOCUMENTS 2244595 12/1991 United Kingdom ............... 372/6 X

OTHER PUBLICATIONS

K. Aida, et al., "Automatic Gain Control of Erbium-Doped Fiber Amplifier by Detecting Spontaneous Emission Power along the Fiber", B-1, vol. J75-B-1, pp. 298-303, May 1992.
K. Aida, et al., "Automatic Gain Control of Erbium-Doped Fiber Amplifier by Detecting Spontaneous Emission Power Along the Fiber", OAA, Jul. 1991, pp. 276-279.
H. R. D. Sunak, "Second Topical Meeting on Optical Amplifiers and Their Applications", LEOS Newletter, vol. 5, No. 5, Oct. 1991, pp. 15-16.
L. Eskildsen, et al., "Automatic Gain and Power Control of Semiconductor Laser Amplifiers", ECOC'90, pp. 621-624.
K. Nakagawa, et al., "A Bit-Rate Flexible Transmission Field Trial Over 300-km Installed Cables Employing Optical Fiber Amplifiers", OAA'91, pp. PdP11 1-4.
C. R. Giles, et al., "Transient Gain and Cross Talk in Erbium-Doped Fiber Amplifiers", Optics Letters, vol. 14, No. 16, Aug. 1989, pp. 880-883.
M. Zirngibl, et al., "Passive Gain Control by All-Optical Feedback Loop in Erbium-Doped Fiber Amplifiers", OFC'91, PD21 1-4.
Kubota, Ukita, and Aida, Kougaku Gijutsu Handbook (Optical Technology Handbook), Dec. 15, 1976, pp. 329-330.

Primary Examiner—Brian Healy
Attorney, Agent, or Firm—Cushman, Darby & Cushman

[57] ABSTRACT

An optical amplifier using either rare-earth doped optical fiber, which can amplify an optical signal when a pumping light is injected, or a laser diode amplifier, which can amplify an optical signal by injection of an electric current. The amplifiers being of simple construction and having a gain which can be maintained constant through feedback control based on the detection of spontaneous emission from the sides of either the rare-earth doped optical fiber or the laser diode. The control being performed without the need for detection of input or output optical signal of the optical amplifier.

24 Claims, 19 Drawing Sheets

OPTICAL FIBER AMPLIFIER INCLUDING RARE EARTH DOPED FIBER AND FEEDBACK PUMP LIGHT SOURCE CONTROL

BACKGROUND OF THE INVENTION

1. Field of the Invention

This invention relates to an optical amplifier for use in an optical transmission system or an optical signal processing system.

2. Description of the Related Art

A laser diode amplifier (LD AMP) or a rare-earth doped optical fiber amplifier have been used as optical amplifiers for optically amplifying an input optical signal to generate a high power optical signal. However, the gain of these amplifiers decreases in proportion to an increase in the optical power of the input signal. Furthermore, when an attempt is made to increase an operating input signal level, the linearity of input to output for the amplifier is disturbed. In order to overcome these problems, a feedback system which detects the input optical signal and output optical signal of an optical amplifier and controls a driving current, in the case of a laser diode amplifier, or controls a pump light source, in the case of a rare-earth doped optical fiber amplifier, has been developed to achieve a constant gain for the optical amplifier.

However, these conventional optical amplifiers have the unavoidable disadvantages of a decreased output level and deteriorated S/N (signal-to-noise) ratio because:

(1) a part of the signal light is lost in the couplers provided at the input and the output sections of the optical amplifier;

(2) the increased number of connections with the couplers; and, (3) excessive signal light loss in the couplers.

Moreover, the optical system and the circuit for controlling the optical amplifier are complicated. These optical amplifiers are also defective because control is performed based on a comparison between the input optical signal and the output optical signal; and therefore, the optical amplifiers cannot be controlled when there is no optical signal. Because the input optical signals are conveying information, there are times in these intensity modulation systems when the optical signals become zero. Thus, control will not be performed at these times. Additionally, the time constant of the control system must be carefully determined with due consideration to statistical characteristics of the input optical signals. Further, as the output optical signal includes spontaneous emission, which has been amplified, control error inevitably increases in the optical amplifier with larger gains.

SUMMARY OF THE PRESENT INVENTION

The object of the present invention is to provide an optical amplifier which eliminates the problems of the above discussed conventional optical amplifiers, is of simple structure, and maintains a constant gain without the need to detect input or output optical signals.

According to a first aspect of this invention, the optical amplifier includes a rare-earth doped optical fiber. A pump light source pumps light into the optical fiber to excite the rare-earth atoms (or ions) therein for amplifying an optical signal incident on the optical fiber. A detector is provided to detect the spontaneous emission power radiated laterally along the optical fiber, and a feedback means controls the output from the pump light source so that the detected spontaneous emission power becomes substantially constant. By keeping the detected spontaneous emission power constant, the optical amplifier gain is kept constant without detection of the input or output optical signal.

The detector preferably includes an integrating sphere which surrounds the rare-earth doped optical fiber, and at least one photodetector placed inside the sphere. The integrating sphere has an inner wall with a complete diffuse reflection surface having a uniform reflectance. The details of such an integrating sphere is described, for instance, in Kubota, Ukita, and Aida, Kougaku Gijutsu (Optical technology) Handbook, pp. 329-330, published by Asakura Shoten. By using such an integrating sphere, it is possible to detect the integrated value of the total amount or its proportional value of the light generated inside the integrating sphere.

Alternatively, the detector means may include at least one photodetector placed close to the side faces of the rare-earth doped optical fiber which are wound in a coil. Such rare-earth doped optical fiber may be circumferentially arranged around the detector; especially a photodetector.

Plural photodetectors may be arranged along the rare-earth doped optical fiber and the outputs of the photodetectors processed by a predetermined operation of the feedback means. The feedback means then controls the pump light source so that the processed photodetector outputs becomes constant.

An optical band pass filter may be arranged between a photodetector, detecting the spontaneous emission power radiated around an optical signal wavelength, and the rare-earth doped optical fiber. A mirror may be arranged at a position across the rare-earth doped optical fiber opposing a photodetector.

The light incident face of a photodetector may be provided with an optical system such as a lens or a prism which compensates for the incident angle dependency of the photodetector's sensitivity.

In addition to the above components, the optical power of the output optical signal of the rare-earth doped optical fiber may be detected. The detected optical power is then integrated over a time period longer than a time constant $\tau_s$ which is based on the statistical characteristics of the optical signal being transmitted. A reference gain of the rare-earth doped optical fiber is then controlled using the integrated value so that the average optical power of the output optical signal becomes substantially constant.

The reference gain may be controlled by indirectly obtaining the optical power of the output optical signal. Specifically, the optical amplifier may include a means to extract information on the pump light power from the feedback means, which controls the pump light source. A first computing means, which previously determined the relationship between optical powers of the pump light and gains of the rare-earth doped optical fiber, computes an optical power of the optical signal output from the rare-earth doped optical fiber using the extracted information. A second computing means, which integrates the computed optical power of the output signal light over a time period longer than the time constant $\tau_s$ ($\tau_s$ being based on the statistical characteristics of the transmitted optical signal), computes the average output power of the output optical signal. Then a means controls the reference gain of the rare-earth doped optical fiber so that the obtained average power of the output optical signal coincides with a predetermined reference value.

There may further be provided a means which sets the gain and wavelength to be obtained by the feedback means. The gain and wavelength being input to this setting means from outside of the feedback means. The setting means further monitors the gain and wavelength produced in the amplifier and generates an alarm if the gain or the wavelength exceeds the controllable limit of the feedback means.

It is preferable that a temperature sensor is placed close to the rare-earth doped optical fiber, and means provided which compensate for both the temperature characteristics of the spontaneous emission and for the wavelength loss of the optical signal traversing the rare-earth doped optical fiber. The compensation performed is based on the operating temperature detected by the temperature sensor.

Plural pump light sources may be provided; and, corresponding to this, detector means having plural photodetectors for detecting the spontaneous emission and feedback means with plural feedback loops may also be provided. The gains produced by such feedback loops may be set at values slightly different from each other.

When using plural pump light sources, photodetectors and feedback loops, a monitor control unit may be provided which monitors the operations of the plural feedback loops, sets the gains produced by the respective feedback loops, and activates or de-activates these feedback loops.

With the provision of plural pump light sources plural drive circuits ma be provided in the feedback means which correspond to each pump light source. Each of the drive circuits may incorporate a circuit to offset the differences in characteristics among the pump light sources. The plural drive circuits are supplied with a common detected value of the spontaneous emission. It is preferable to structure the respective pump light sources and corresponding drive circuits in integrated pump modules. Furthermore, there may also be provided a means for separately switching each of the plural pump modules ON/OFF, a low pass filter having a band narrower than the control band of the feedback means placed at an input of each pump module, and a means for inserting the low pass filters at the input of each pump module during an initial state and for removing a low pass filter from the input after a predetermined time has elapsed from when a corresponding pump module was switched from OFF to ON.

Two units of the types of optical amplifiers described above may be connected in cascade so that the gains of the optical amplifier unit have a distribution where the following optical amplifier unit has a smaller gain than that of the preceding optical amplifier unit. The gain of the following optical amplifier unit may be negative or lossy (causes a loss in amplification).

Further, a means may be added which changes the gain distribution among the optical amplifiers units connected in cascade. This way, the net gain of the optical amplifier system becomes constant even if every optical amplifier unit did not achieve its set reference gain.

The second aspect of this invention concerns an optical amplifier using a laser diode amplifier instead of a rare-earth doped optical fiber. The laser diode amplifier is pumped by an injection of electric current to amplify light incident thereon, and a drive circuit supplies pumping current to the device. A detector is provided to detect a value corresponding to the total amount of spontaneous emission from the side faces of the laser diode amplifier, and a feedback means controls the output drive current supplied by the drive circuit so that the values from the detector become substantially constant.

The provision of a temperature sensor close to the laser diode amplifier, and a means to compensate for i temperature characteristics of the spontaneous emission from the laser diode amplifier and temperature characteristics of the wavelength of the optical signal is preferable. The compensation is especially concerned with the temperature characteristics of the optical signal wavelength within an active layer of the laser diode amplifier. The compensation is based on the operating temperature detected by the temperature sensor.

Similar to an optical amplifier using a rare-earth doped optical fiber, plural units of laser diode amplifiers may be connected in cascade, and a means added which changes the gain distribution among the laser diode amplifier units so that the net gain of the optical amplifier system becomes constant even if every optical amplifier unit does not achieve its set reference gain.

Other objects, features, and characteristics of the present invention; methods, operation, and functions of the related elements of the structure; combination of i parts; and, economies of manufacture will become apparent from the following detailed description of the preferred embodiments and accompanying drawings, all of which form a part of this specification, wherein like reference numerals designate corresponding parts in the various figures.

DETAILED DESCRIPTION OF THE PREFERRED EMBODIMENTS

Figure 1:
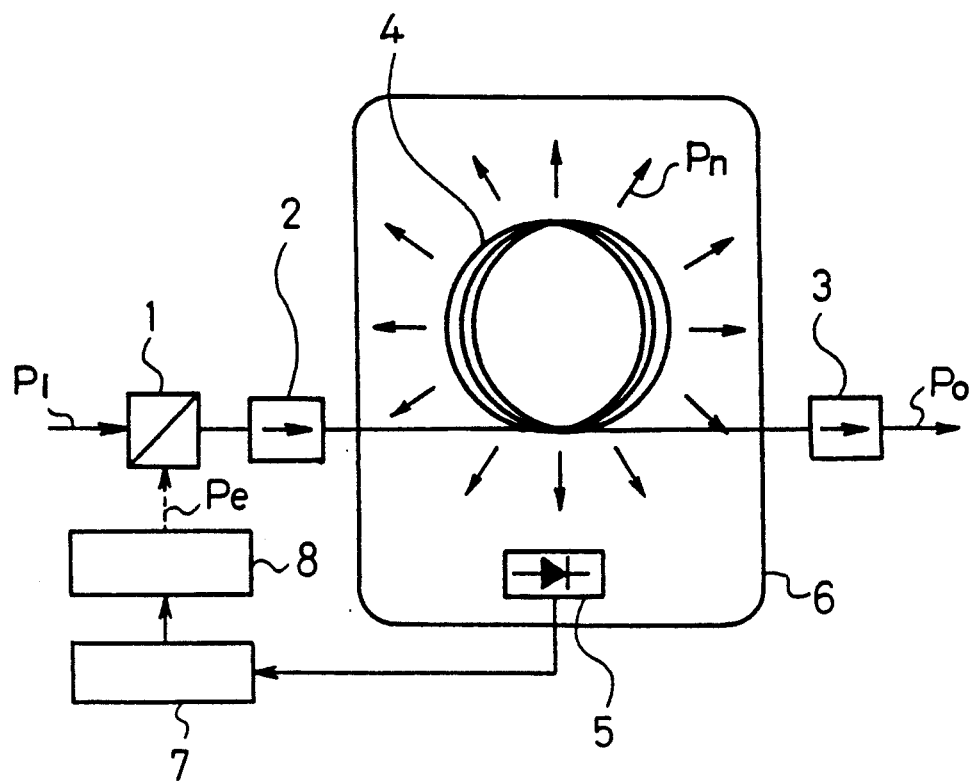
FIGS. 1 to 18 show, respectively, the construction of different embodiments of this invention.

FIG. 1 shows the first embodiment of an optical amplifier according to this invention wherein the reference number denotes a WDM (wavelength division multiplexing) coupler, 2 and 3 denote isolators, 4 denotes a rare-earth doped optical fiber, 5 denotes a photodetector, 6 denotes an integrating sphere, 7 denotes a drive circuit, and 8 denotes a pump light source. The rare-earth doped optical fiber 4, doped with rare-earth atoms (or ions) such as erbium, is provided within a known integrating sphere 6 together with a photodetector 5. One end of the rare-earth doped optical fiber 4 is connected with WDM coupler 1 and isolator 2 to receive an input light Pi (input optical signal) and a pump light Pe from pump light source 8. The other end of the rare-earth doped optical fiber 4 is connected to an isolator 3 for outputting an output light Po (output optical signal). The optical amplifier is structured in a manner that the integrated value of the spontaneous emission Pn from the side of the rare-earth doped optical fiber 4 is detected by the photodetector 5, and the pump light source 8 is controlled by the drive circuit 7 so that the values detected by the photodetector become constant.

The gain G of a rare-earth doped optical fiber amplifier is expressed as below.

$$G = \exp\left(\int_o^L \gamma(z)\, dz\right) \quad (1)$$

wherein $\gamma(z)$ denotes a local gain of the rare-earth doped optical fiber, L denotes the length of the rare-earth doped optical fiber, and the local gain $\gamma(z)$ of the rare-earth doped optical fibers is a function of the position on the rare-earth doped optical fiber, the strength of the pump light and the intensity of the optical signal.

The local gain $\gamma(z)$ may be expressed in terms of the spontaneous emission Pn(z) on the sides of the rare-earth doped optical fiber and other constants as below.

$$\gamma(z) = C \cdot Pn(z) - \alpha_s \quad (2)$$

wherein
$C = [\eta\{\sigma_{emi}(\lambda_s) + \sigma_{abs}(\lambda_s)\}\tau] / (h \cdot v_n \cdot \pi \cdot \Gamma_{Er}^2)$
$\alpha_s = \eta \cdot \sigma_{abs}(\lambda_s) \cdot \rho$
$\sigma_{abs}(\lambda_s)$: absorption cross-section at signal wavelength
$\sigma_{emi}(\lambda_s)$: stimulated emission cross-section at signal wavelength
$\eta$: overlap factor
$\tau$: life time of spontaneous emission
$\rho$: doping level of erbium (Er)
$h$: Planck's constant
$v_n$: average frequency of spontaneous emission
$\Gamma_{Er}$: radius of the area doped with Er The letters $\alpha_s$ (absorption loss of the rare-earth doped fibers due to a faint optical signal) and C are the constants which are not dependent on the position on the fiber, the strength of the pump light, and the intensity of the optical signal.

From the equations (1) and (2), the gain G may be represented by the equation below.

$$G = \exp\left(\int_o^L Pn(z)\, dz - \alpha_s \cdot L\right) \quad (3)$$

By controlling the integrated value of the spontaneous emission Pn(z) from the sides of the rare-earth doped optical fiber along the length of the fiber to be a given value, the gain G can be maintained at a constant level because C and $\alpha_s \cdot L$ are constants.

The first embodiment of this invention shown in FIG. is structured so that the rare-earth doped optical fiber 4 and the photodetector 5 are arranged inside the integrating sphere 6. Thus, the integrated value of the spontaneous emission Pn from the side of the rare-earth doped optical fiber 4 is detected. The drive circuit 7 then controls the pump light source 8 based on the values detected by photodetector 5 so that the detected values become constant; thereby keeping the gain G constant. If a plurality of photodetectors are used, the precision of detecting the integrated value of the spontaneous emission Pn can be improved. Reliability can be greatly improved by using a plurality of pump light sources so that even if a light source fails, the gain G can be kept at a constant level by the remaining pump light sources without suspending transmission of an optical signal.

By arranging a rare-earth doped optical fiber and at least one photodetector within an integrating sphere, detecting the integrated value of the spontaneous emission from the side faces of the rare-earth doped optical fiber, and controlling at least one pump light source to maintain the detected values at a constant level; the gain of the optical amplifier can be maintained at a constant level without the need to detect the input and output optical signal. Furthermore, changes in the gain of the optical amplifier which may be caused due to signal mark density variation can be perfectly inhibited.

Figure 2:
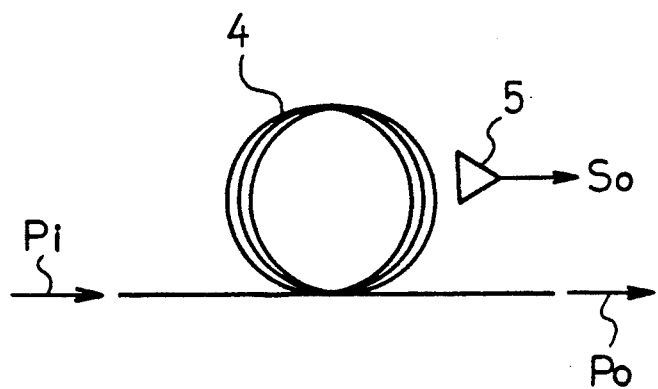

FIG. 2 shows the second embodiment of the optical amplifier according to this invention wherein rare-earth doped optical fiber 4 is wound in a coil, a photodetector 5 is arranged by the side thereof to detect the spontaneous emission from the side of the rare-earth doped optical fiber 4, and a pump light source (not shown) is controlled to make the values detected by photodetector 5 constant.

With this structure, when the diameter of the coil of the rare-earth doped optical fiber 4 is set at R, the spontaneous emission from the side thereof may be sampled at an interval of $\pi \cdot R$ to detect the sum thereof using one photodetector. The sum is an approximate value of the integrated value of the spontaneous emission from the side of the rare-earth doped optical fiber 4. The amplifier is structured to control the pump light source so that the detected sum So becomes constant; and therefore, the gain becomes a constant. Reliability can be greatly improved by using plural pump light sources so that even if a pump light source fails, the gain can be kept at a constant level by the remaining pump light sources without suspending transmission of an optical signal.

Figure 3:
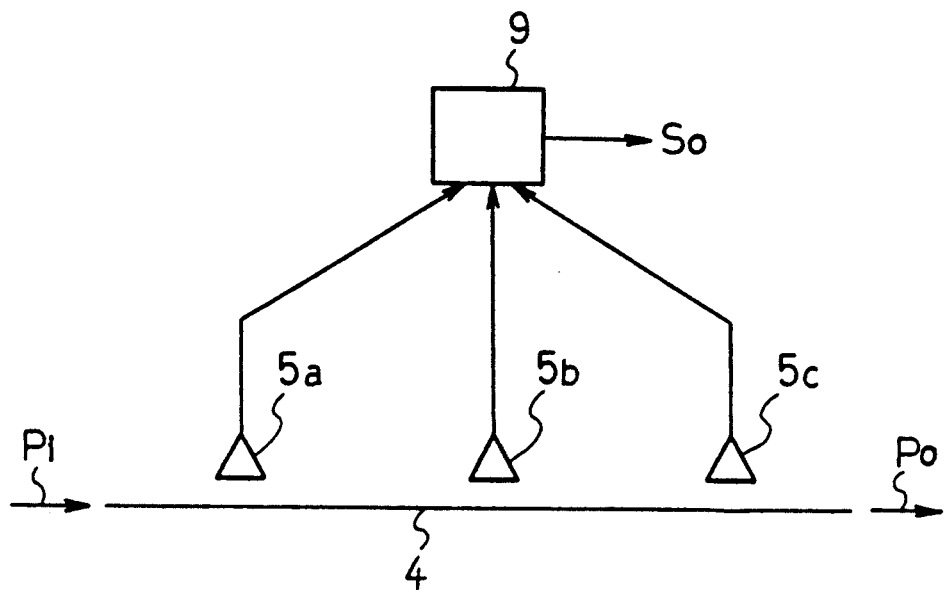

FIG. 3 shows the third embodiment of this invention wherein photodetectors 5a, 5b, and 5c are placed at different positions along the side of the rare-earth doped optical fiber 4 to detect the distance distribution characteristics of the spontaneous emission from the side of the rare-earth doped optical fiber 4. The values detected by photodetectors 5a, 5b, and 5c are processed by a computing unit (CPU) 9 to produce output So, an approximate of the integrated value of the spontaneous emission from the side of the rare-earth doped optical fiber 4, and the pump light source (not shown) is controlled so that So becomes constant.

With this structure, CPU 9 may obtain So by multiplying the detected values obtained from the photodetectors 5a, 5b, and 5c with a weight coefficient and summing the weighted values. Furthermore, the gain of the optical amplifier may be kept constant by controlling the pump light sources so that So is kept constant. Because the local gain distribution in the longitudinal direction of the rare-earth doped optical fiber is measured in this embodiment, the length characteristic G(z) of the gain G can be determined. Moreover, the noise figure NF, which is as an important factor affecting S/N ratio, can be determined. The noise figure NF may be expressed as below.

$$NF = \{2/(1 + \sigma_s^a/\sigma_s^e)\} \cdot [\{\alpha_s\, G(L)/(G(L) - 1)\} \cdot \int_o^L (1/G(z))\, dz + 1] \quad (4)$$

wherein $\sigma_s^a$: absorption cross-section at signal wavelength $\sigma_x^e$: stimulated emission cross-section at signal wavelength A two-way pumping method is used for excitation. Using this pumping method, the gain G may be controlled with higher precision, than using a one way pumping method (forward or backward pumping), by controlling the pump light source based on equations (3) and (4). Additionally, the changes in noise figure NF with respect to the changes in the input optical signal are minimized. Similar to the optical amplifiers shown in FIGS. 1 and 2, reliability can be greatly improved by using plural pump light sources so that even if a pump light source fails, the gain G can be kept at a constant level by the remaining pump light sources without suspending transmission of an optical signal.

Figure 4:
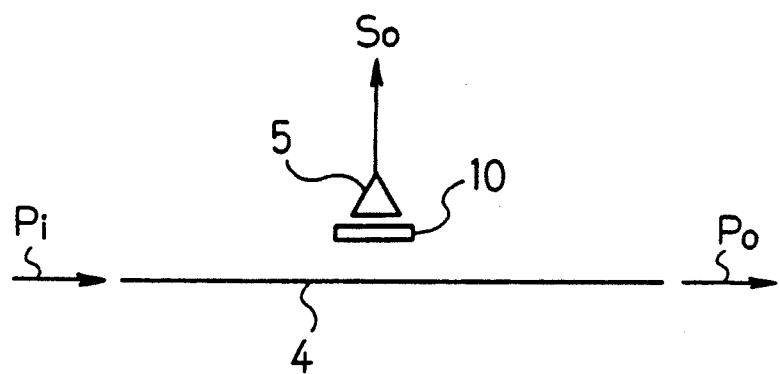

FIG. 4 shows the fourth embodiment of this invention wherein an optical band pass filter 10 is placed between the rare-earth doped optical fiber 4 and the photodetector 5. The optical band pass filter 10 selectively transmits the optical band of the optical signal. This structure can remove lights of wavelengths other than those used in the optical amplifier operation to thereby control the gain more precisely.

Figure 5:
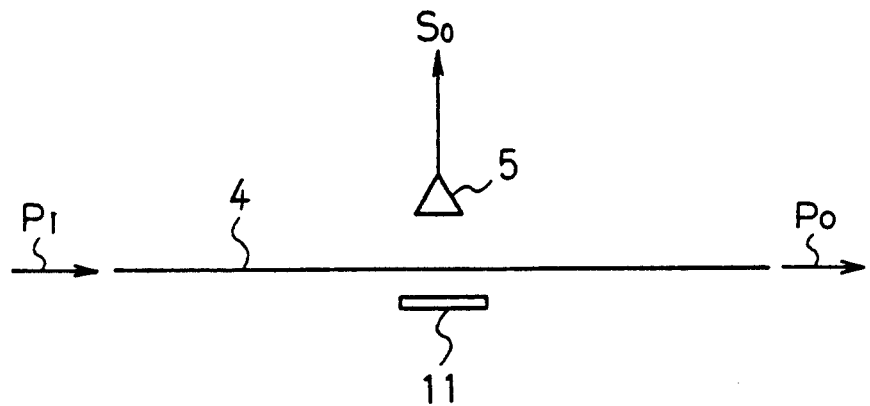

FIG. 5 shows the fifth embodiment of this invention. A mirror 11 is positioned opposing the photodetector 5 across the rare-earth doped optical fiber 4. This increases spontaneous emission incident on the photodetector 5, thus increasing the S/N ratio in the control system.

Figure 6:
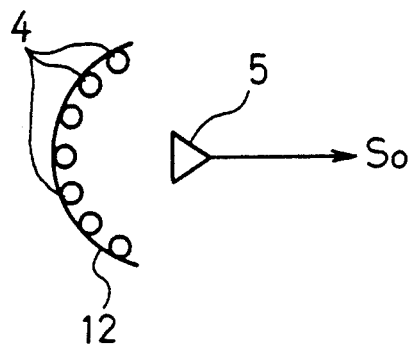

FIG. 6 shows the sixth embodiment of this invention wherein rare-earth doped optical fiber 4 is provided on a predetermined circumference 12 around a photodetector 5. This permits even detection of the spontaneous emission from respective parts of the rare-earth doped optical fiber 4, thus increasing the detection precision of the integrated value of the spontaneous emission.

Figure 7:
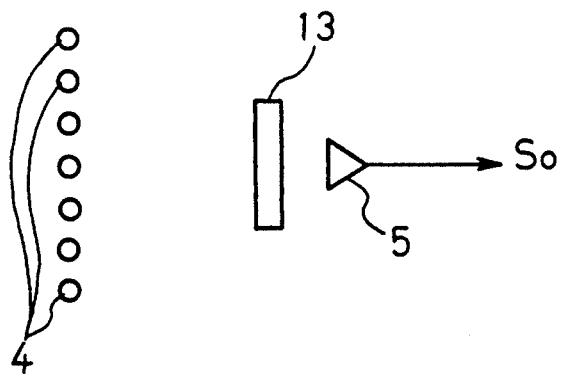

FIG. 7 shows the seventh embodiment of this invention wherein a space filter or an optical system 13 is provided between the rare-earth doped optical fiber 4 and photodetector 5 to compensate for the dependency of detection sensitivity of photodetector 5 on the incident-angle of the spontaneous emission. The optical system 13 may be a lens or a prism. This structure allows even detection of the spontaneous emission from each part of the rare-earth doped optical fiber 4, thus increasing the detection precision of the integrated value of the spontaneous emission.

Figure 8:
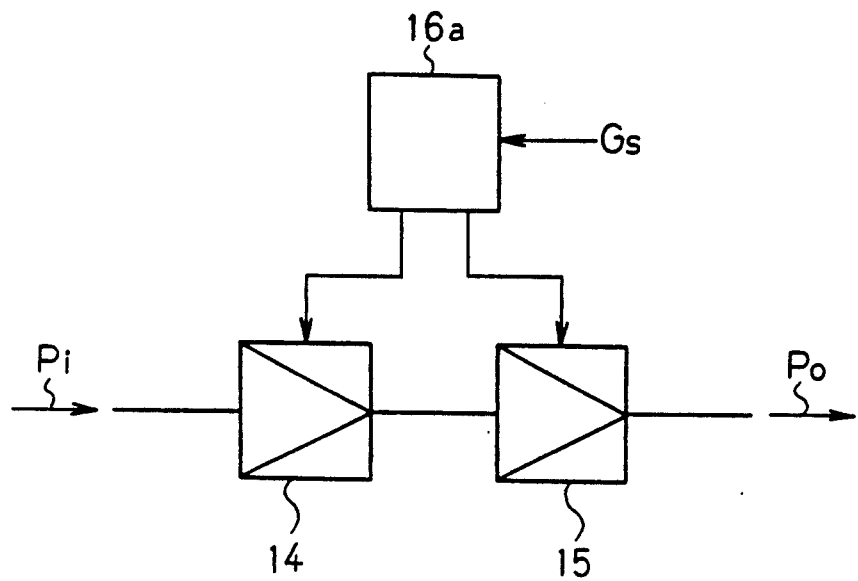

FIG. 8 shows the eighth embodiment of this invention wherein two optical amplifiers 14 and 15 are cascaded (connected in series) forming an optical amplifier system. Gs is a reference (target) gain to be achieved by the optical amplifier system which is input from the outside by control unit 16a. The control unit 16a sets reference gains G14 and G15 to be achieved by optical amplifiers 14 and 15 respectively. Gs, G14 and G15 have the following relation ship: G15=Gs/G14 and G14>G15. As described above, the preceding optical amplifier 14, which inputs input light Pi, is set to have a reference gain G14 greater than the reference gain G15 set for the following optical amplifier 15. The optical amplifier 14 (the preceding optical amplifier) inputs input light Pi and is set to have a higher gain than the optical amplifier 15 (the following optical amplifier). Optical signals output from the optical amplifier 14 are input by optical amplifier 15 which outputs output light Po and is set to have a lower gain than the optical amplifier 14. The gain of the optical amplifier 15 may be negative. This structure controls the gain of the following optical amplifier without deteriorating the net noise figure NF which may otherwise be caused when the gain of the preceding optical amplifier is decreased. Therefore, the gain of the whole system may be greatly varied. The optical amplifiers in the embodiment of FIG. 8 can be any optical amplifier which operates to achieve a set reference gain, such as several of the embodiments described in the present invention.

Figure 9:
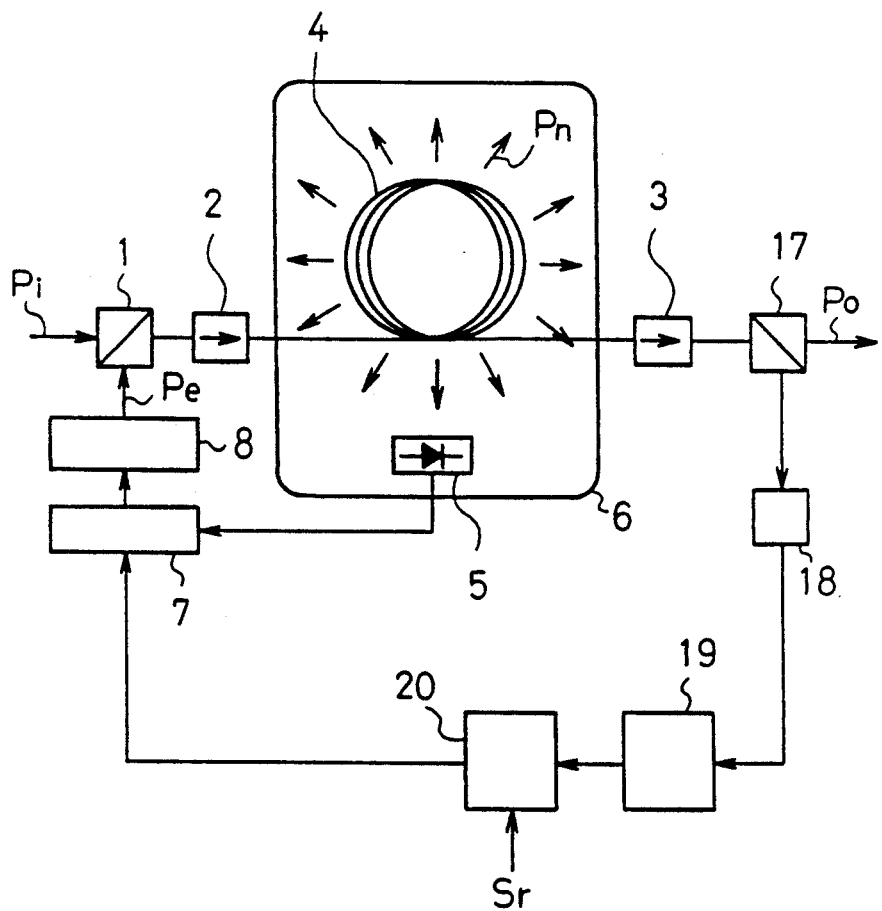

FIG. 9. shows a ninth embodiment of this invention wherein the output light Po from the optical amplifier is directed by isolator 3 through a distributor 17. The distributor 17 directs output light Po to a photodetector 18 where the signal power of output light Po is detected. The detected signal power is integrated by an integrator 19 over a time period longer than the time constant $\tau_s$, (the time when the chronological changes of the integrated value becomes zero) which is based on the statistical characteristics of the input optical signals. The integrated value is then compared by a comparator 20 with a reference value Sr of the integrated signal power. Based on the comparison, the pump light source 8 is controlled by a drive circuit 7 so that the average output optical signal power is made constant.

The following is background information for understanding the merits of this embodiment. In an optical repeater/transmitter system, the input signal power of an optical amplifier varies according to changes (temperature characteristics, chronological change characteristics) in the loss occurring in the optical fiber transmission line. The smaller the loss in the optical fiber becomes, the larger becomes the power of the input optical signals. However, if the gain of the optical amplifier is kept constant, the output signal power will occasionally exceed an input limit (due to the nonlinear effect) of the optical fiber. As the optical fiber loss increases, the input signal power decreases; but, if the gain of the optical amplifier is kept constant, the output signal power also decreases, deteriorating the S/N ratio of the transmission system. Therefore, the output signal power of the optical amplifier should be maintained at the reference value (a constant value).

A limiter amplifier may partially solve the above problems, but the linearity of the input/output cannot be maintained when a light amplitude modulation system is used. In an analog transmission system, the distortion factor would increase; and, in a digital system, the error rate deteriorates. Moreover, the optical repeater/transmitter system generally requires an output signal power as high as +10 dBm for the optical amplifier, but this value is within the saturation region of the optical amplifier. Therefore, unless the gain is made constant, the transmission characteristics deteriorate. In short, optical amplifiers used in optical transmission systems must simultaneously overcome apparently contradictory problems (i.e., constant signal power output and constant gain). In other words, there appears to be a trade-off between obtaining a constant signal power output and obtaining a constant gain.

The optical amplifier shown in FIG. 9 controls the reference gain of the optical amplifier using the integrated value of the optical power of the output light Po so that the average power of the output light Po becomes constant. The pump light source is controlled, based on a time period sufficiently shorter than the spontaneous emission life time $\tau$ of the rare-earth doped optical fiber, using the reference gain and the integrated spontaneous emission; thereby causing the gain to coincide with the reference gain. As a result, the linearity of the input/output of the amplifier is maintained, preventing deterioration in transmission characteristics. Since, the output level is kept constant (the averaging time is longer than the time constant $\tau_s$), transmission characteristics deterioration is not caused by an input limit of the optical fiber, and the S/N ratio does not deteriorate.

Figure 10:
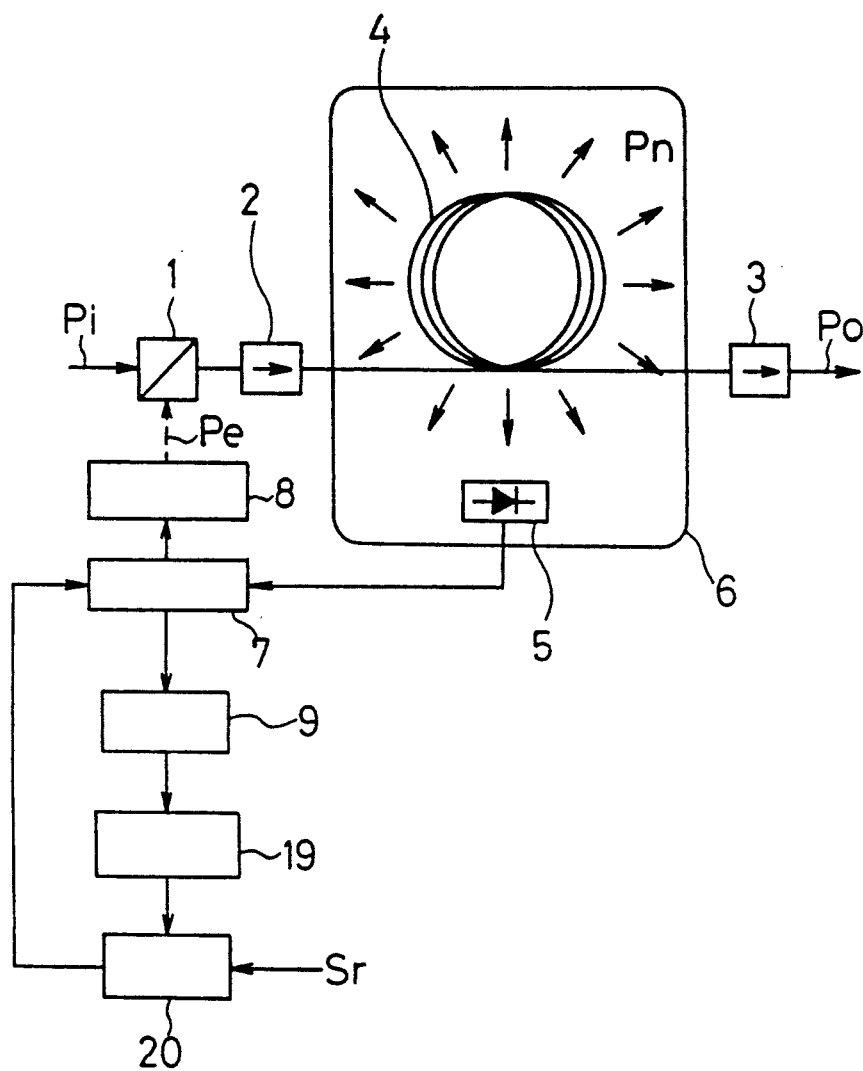

FIG. 10 shows the tenth embodiment of this invention wherein operation information of the pump light power is extracted from the drive circuit 7. The output signal level (optical power of the output optical signal) is calculated by the computing unit 9 based on the relationship between the extracted operation information and the reference gain of the optical amplifier. The average output signal power is calculated by integrating the output signal level by an integrator 19 over a time period longer than the time constant $\tau_s$, which is based on the statistical characteristics of the optical signals. The average output signal power and the reference value Sr of the output signal level are compared by a comparator 20, and the pump light source 8 is controlled based on the comparison results by the drive circuit 7 so that the average output signal power becomes constant.

Figure 19:
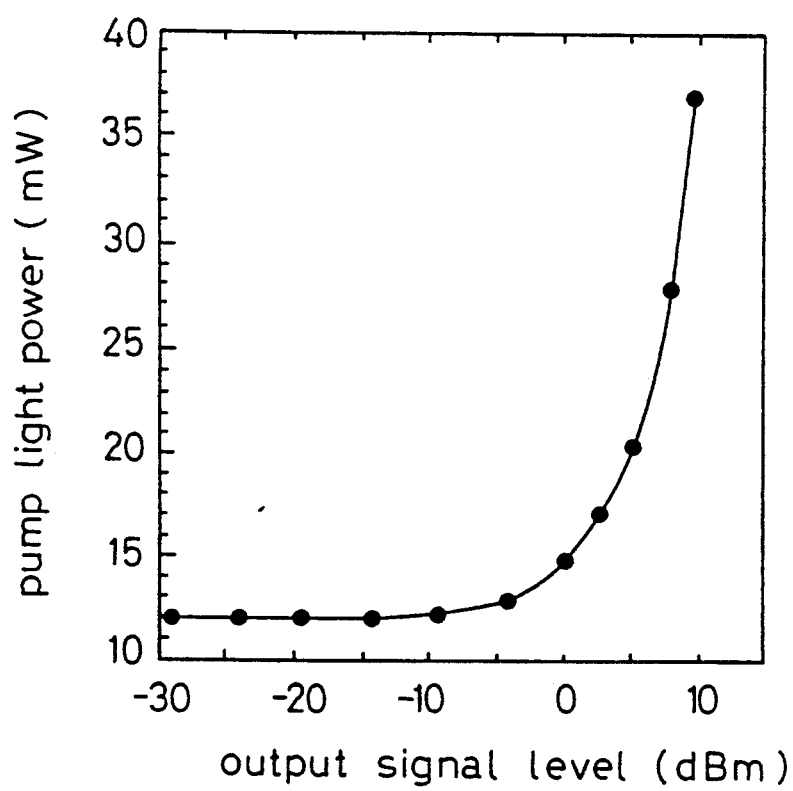
FIG. 19 is a graph showing the relationship between the output optical signal level and the optical pumping power.

The graph in FIG. 19 shows an example of the relationship between the output signal level and the pump light power when the gain is kept constant at 20 dB. In the region where the output signal level exceeds 0 dBm, when the pump light power is set at a level, the output signal level can be automatically determined. This fact is used by the embodiment shown in FIG. 10, wherein the gain is made coincident with the reference gain by maintaining as constant the average output signal power, and controlling the pump light sources based on the reference gain and the integrated spontaneous emission, over the time period sufficiently shorter than the metastable level lifetime $\tau$ of the rare-earth doped optical fiber. As a result, the linearity of the input/output of the optical amplifier is maintained, and no deterioration of transmission characteristics occurs. Moreover, the output signal level is also maintained at a constant level (the average value over a time period longer than the time constant $\tau_s$ is maintained constant), so that deterioration in transmission characteristics or of the S/N ratio which otherwise would be caused due to the input limit of the optical amplifier is avoided. A coupler at an output of the optical amplifier to divide the output optical signals and a means to detect the power thereof is unnecessary; therefore, the optical amplifier structure becomes simple and the loss otherwise caused by such a coupling is avoided. This results in a higher output.

Figure 11:
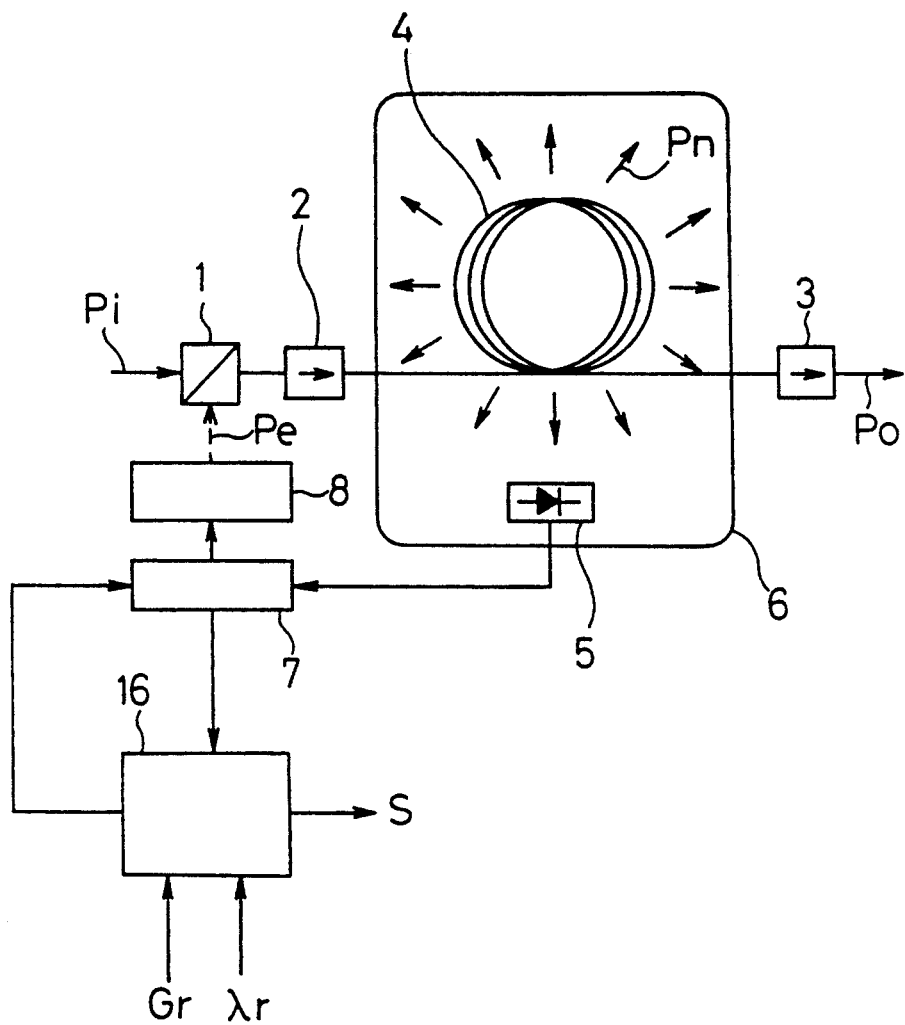

FIG. 11 shows the eleventh embodiment of the optical amplifier according to this invention wherein a control unit 16 inputs a gain Gr and a wavelength $\lambda_r$ for the gain Gr from outside and compares the gain Gr with a gain obtained by converting the integrated value of the spontaneous emission (the measured gain of the optical amplifier). The pump light source 8 is controlled by the drive circuit 7 based on the results of the comparison, and when the control amount (drive current) to the pump light source 8 exceeds the operational limit, an alarm $S_{AL}$ is generated.

In actual operation the measured gain is compared to gain Gr as follows: the control unit 16 calculates an integration value of the spontaneous emission corresponding to the gain using equation (3), Gr, and $\lambda_r$; and transmits a reference value of the spontaneous emission to the drive circuit 7. The drive circuit 7 compares the reference value with the detected integrated value of the spontaneous emission to control the pump light source 8. Drive circuit 7 also transmits to the control unit 16 control information which relates to the driving current applied to the pump light source 8. The control unit 16 can then generate an alarm $S_{AL}$ when the set gain or input signal level is too high and the control amount (drive current) for the pump light source 8 exceeds an operating limit. Therefore, it becomes possible to check whether or not the optical amplifier is operating normally.

Likewise, a similar operation can be performed based on the wavelength of the gain with reference to the reference wavelength of the gain $\lambda_r$. An alarm is then generated when the wavelength of the gain exceeds a controllable limit.

Figure 12:
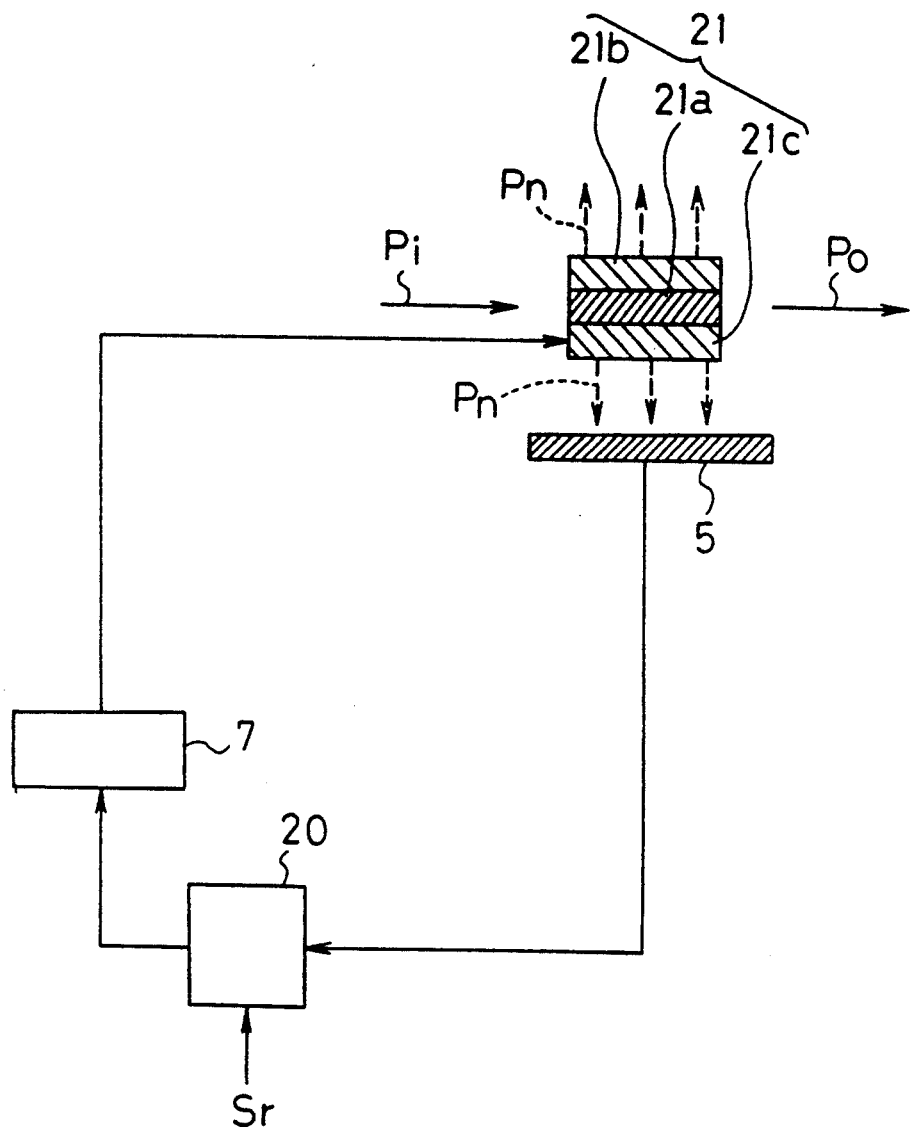

FIG. 12 shows the twelfth embodiment of the optical amplifier according to this invention wherein a photodetector 5 is placed at the side of a laser diode amplifier 21. The laser diode amplifier has an active layer 21a, electrodes 21b and 21c, and is driven by an electric current. The total amount of spontaneous emission from the sides of the amplifier 21 or a proportional value Pn of the total amount is detected by photodetector 5. The detected value is then compared to reference value Sr by a comparator 20, and the drive circuit 7 controls the driving current supplied to laser diode amplifier 21 so that the detected value is maintained constant.

Similar to the case of a rare-earth doped optical fiber amplifier, the gain G of a laser diode amplifier is expressed by the following equation.

$$G = \exp\left( C \int_o^L Pn(z)\, dz - a_s \cdot L \right) \quad (3)$$

Since C and $a_s \cdot L$ are constants, the gain G can be maintained at a constant level by controlling to a constant value the value obtained by integrating the spontaneous emission Pn(z) from the sides of the laser diode amplifier along the length of the active layer. $a_s$ and C, constants which are not dependent on the position of the active layer, the pumping strength, and the signal power intensity respectively are expressed below.

$$C = \Gamma a \cdot A \cdot \tau / (\nu \cdot h \cdot \nu_n \cdot S)$$

$$a_s = \Gamma a \cdot A \cdot nO, \; a/\nu$$

wherein
$a_s$: absorption loss of the active layer for small level signal light
h: Planck's constant
$\Gamma a$: confinement coefficient ($a$ denotes polarization mode (TE or TM)
A: differentiated gain coefficient
$\tau$: carrier life time
v: light velocity through medium
$\nu_n$: average frequency of spontaneous emission
S: cross-section of the active layer
nO, $a$: carrier density where gain is produced Since the spontaneous emission from the sides of the laser diode amplifier is not uniform, it is desirable to obtain the total amount of spontaneous emission by integrating all spontaneous emission along the entire length of the active layer. However, for practical purposes, it is sufficient to measure a value proportional to the total spontaneous emission along the entire length of the active layer. By controlling the laser diode amplifier to maintain this proportional value constant, the gain G may be maintained constant because C and $a_s \cdot L$ are constants.

Figure 13:
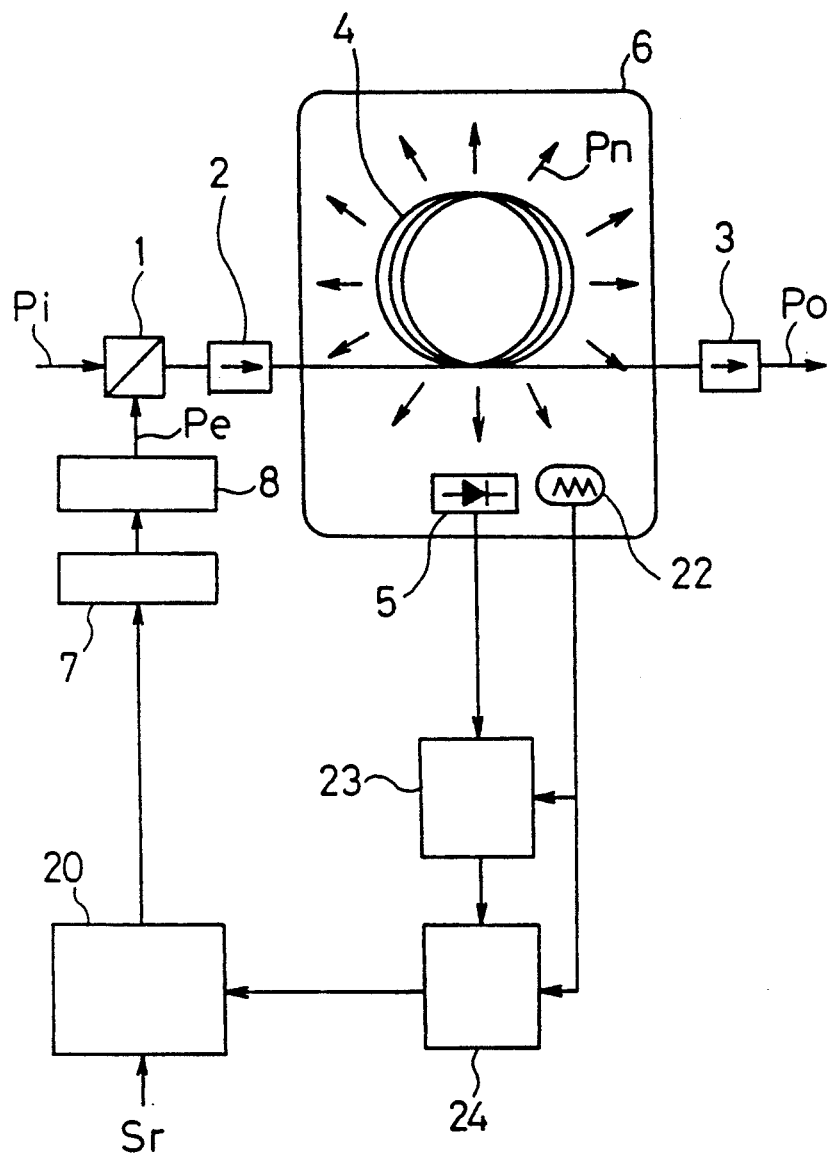

FIG. 13 shows the thirteenth embodiment of the optical amplifier according to this invention wherein a temperature sensor 22 is placed in the neighborhood of the rare-earth doped optical fiber 4 to detect the operational temperature thereof. The temperature characteristics of the spontaneous emission Pn and the temperature characteristics of the loss in the signal light wavelength of the fiber 4 are compensated by a temperature characteristic compensating circuit 23 based on the detected values from photodetector 5 and temperature sensor 22. The gain is calculated based on the output from the temperature characteristics compensating circuit 23 by a gain computing circuit 24. The calculated gain is then compared with the reference value Sr by a comparator 20, and the pump light source 8 is controlled by the drive circuit 7 based on the comparison result so that the gain becomes constant. Although spontaneous emission is dependent on temperature, this embodiment has a means to compensate for this dependency. The loss in the optical signal wavelength due to the rare-earth doped optical fiber 4 is also dependent on temperature, but it too is compensable. As a result, when the gain of the optical amplifier is calculated from the spontaneous emission, the errors otherwise caused due to temperature characteristics may be avoided through compensation and the gain controlled so that it remains constant.

Similar to this embodiment, a temperature sensor may be placed in the neighborhood of the laser diode amplifier in the embodiment shown in FIG. 12 to compensate for the temperature characteristics of the spontaneous emission or the optical signal wavelength; especially the temperature characteristics of the optical signal wavelength in the active layer of the laser diode amplifier based on the operating temperatures detected by the sensor.

Figure 14:
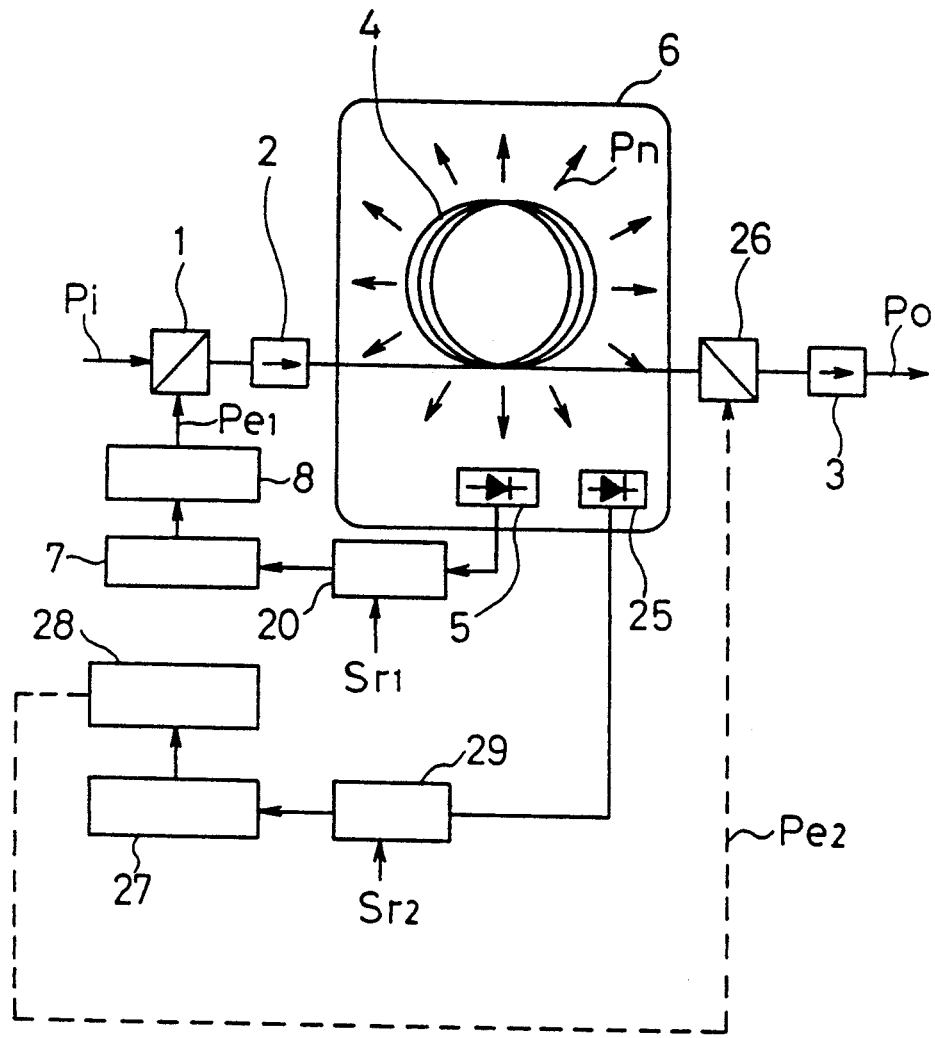

FIG. 14 shows the fourteenth embodiment of this invention wherein plural pump light sources 8 and 28 are provided, photodetectors 5 and 25 are provided within an integrating sphere 6, and plural feedback loops are arranged corresponding to each of the pump light sources 8 and 28. A coupler 26 is inserted between an end of the rare-earth doped optical fiber 4 and the isolator 3. In the first feedback loop, the spontaneous emission Pn from the side of the rare-earth optical fiber 4 detected by the photodetector 5 is compared with the reference value Sr1 by a comparator 20. Then the pump light Pe1 from the pump light source 8 is controlled by the drive circuit 7 based on the result of the comparison. In the second loop, the detected value from the photodetector 25 is compared with the reference value Sr2 by the comparator 29, and the pump light Pe2 from the pump light source 28 is controlled by the drive circuit 27. Because the gains by the two feedback loops or the reference values Sr1 and Sr2 at the two comparators 20, 29 are slightly different from each other, the loop which is set to have the largest gain is actively operated, and the pump light source(s) in the other loop(s) is (are) operated at a minimum operation state (which is determined by the circuit design). Therefore, the pump light source(s) of the other loop(s) is(are) kept at hot standby with respect to operation, but kept at cold standby with respect to reliability. Thus, when the predetermined gain cannot be obtained due to failure of a pump light source or its control system in the active feedback loop, and the gain of the optical amplifier decreases to a level lower than the gain which can be achieved by the second feedback loop set to have the second largest gain, then the second feedback loop will begin active operation so that the optical amplifier gain does not decrease further.

Figure 15:
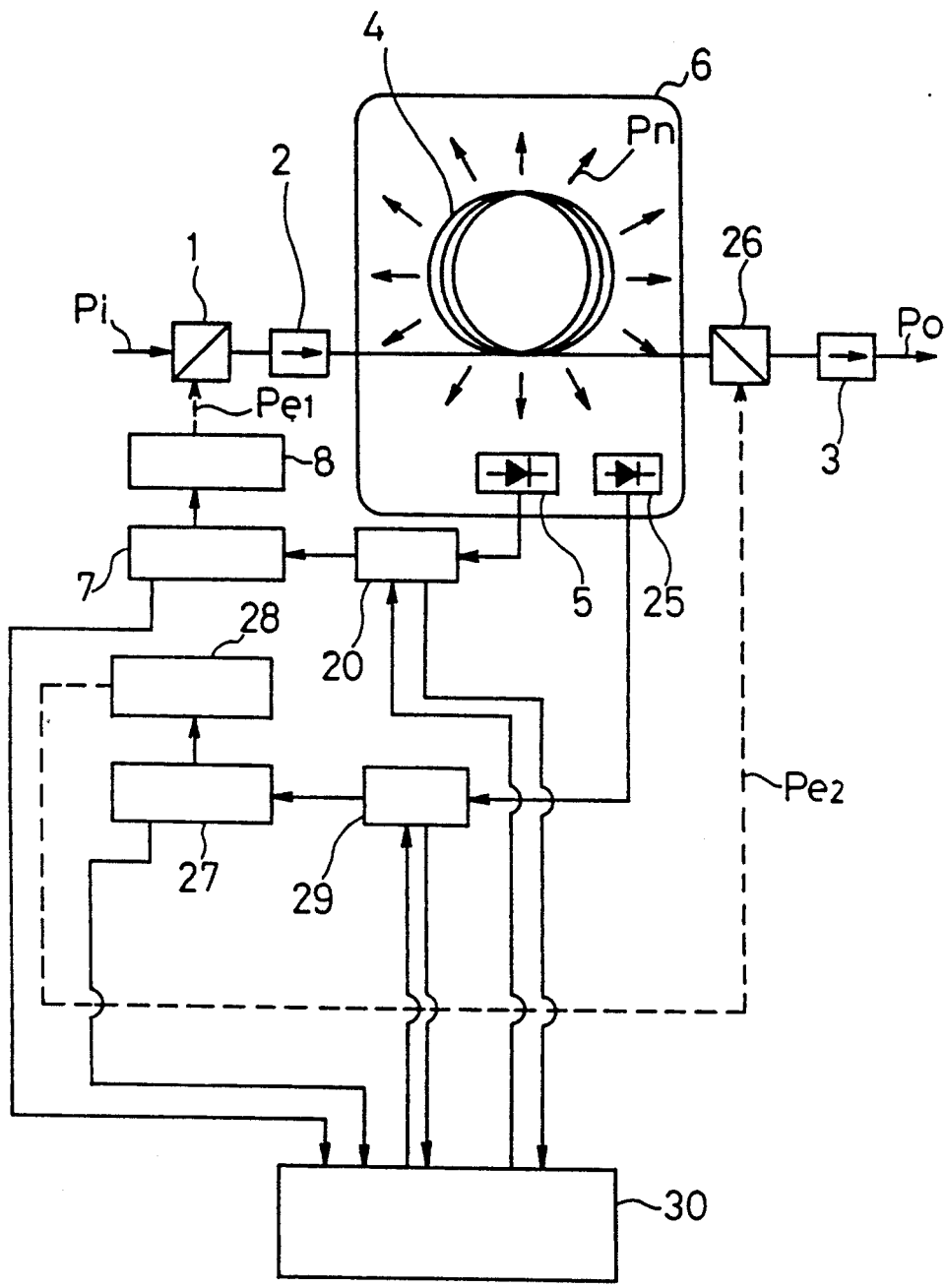

FIG. 15 shows the fifteenth embodiment of this invention wherein a monitor control unit 30 monitors operations of the drive circuits 7 and 27 and the comparators 20, 29; and, controls the reference gain setting at comparators 20 and 29 and the switching thereof.

In this embodiment, in addition to the structure of the optical amplifier shown in FIG. 14, a monitor control unit 30 is provided to monitor the operations of the plural feedback loops and to control the reference gain settings and switching thereof. If a failure occurs in the first feedback loop and its gain increases, the monitor control unit 30 switches the failed first feedback loop off. The gain of the optical amplifier then lowers to a level below the gain set at the second feedback loop, and the second feedback loop automatically begins active operation to prevent the optical amplifier gain from lowering further. Therefore, even if the signal level slightly decreases, the optical signal can be amplified without a break, even an instantaneous one. Moreover, the monitor control unit 30 can restore the optical amplifier to its original state by re-setting the gain produced by the second feedback loop to the same gain set for the first feedback loop.

Figure 16:
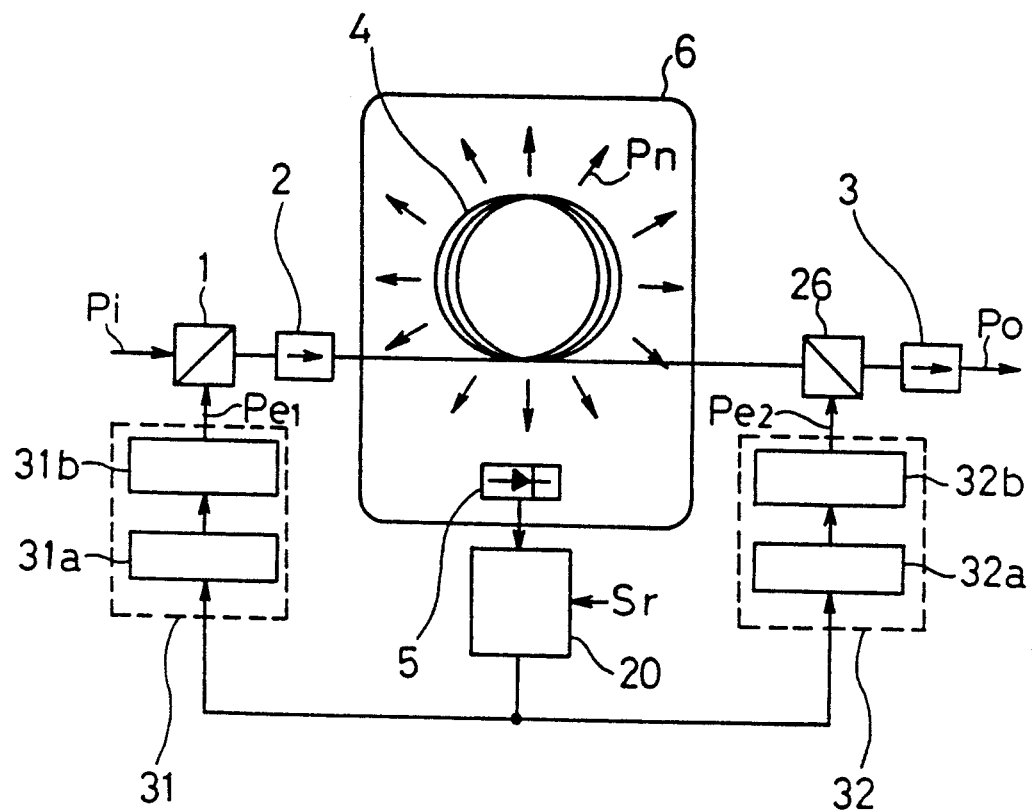

FIG. 16 shows the sixteenth embodiment of this invention wherein a pump module 31 incorporates a drive circuit 31a and a pump light source 31b. The pump light source 31b has a circuit for offsetting the difference in characteristics between the pump light sources so that the characteristics of all the pump light sources are identical when viewed from the comparator 20. A pump module 32 contains drive circuit 32a and pump light source 32b with similar offsetting circuits. Pump module 32 is connected to comparator 20 in parallel with pump module 31 to enhance reliability. The optical amplifier gain is controlled to be constant by the one of the pump modules 31 and 32, and, in the event of failure the other pump module 32 or 31, can control the optical amplifier gain to be constant. Thus, optical signal transmission is not suspended even for an instant, enhancing the reliability of the optical amplifier.

Figure 17:
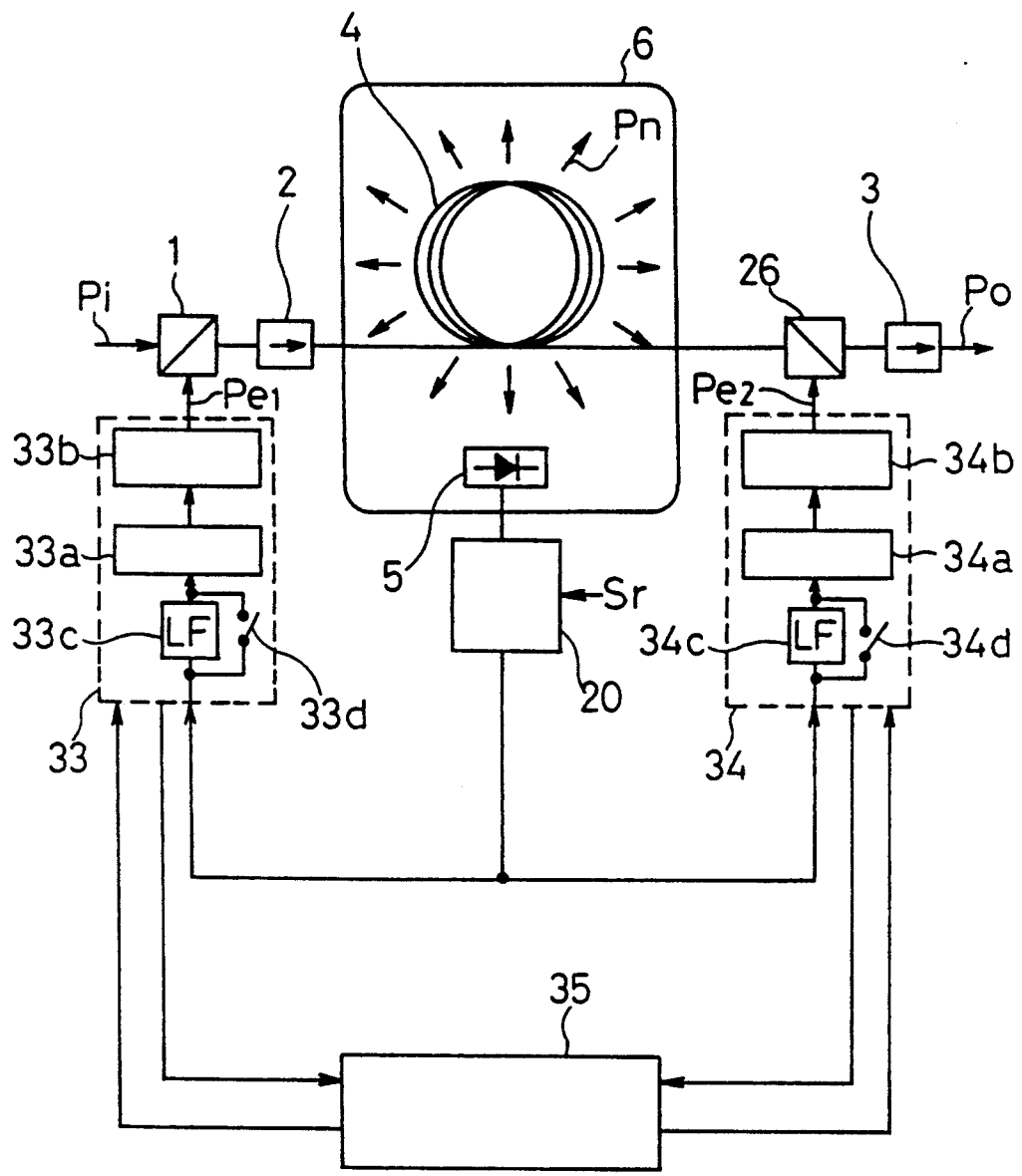

FIG. 17 shows the seventeenth embodiment of this invention. In this embodiment, two pump modules 33 and 34 are connected in parallel to a control unit 35. Pump module 33 is connected to coupler 1 and pump module 34 is connected to coupler 26. Pump module 3 integrally includes a drive circuit 33a having a circuit to offset the difference in characteristics between pump light sources so that the characteristics of all the pump light sources are identical to each other when viewed from the comparator 20. The pump module 33 further integrally includes a pump light source 33b, a low pass filter 33c having a band pass width narrower than the control band of the comparator 20, and by-pass switch 33d for by-passing low pass filter 33c. Pump module 34 integrally includes a similar drive circuit 34b with offset circuit, a pump light source 34b, a low-pass filter 34c and a by-pass switch 34d. The control unit 35 inserts low pass filters 33C and 34C within the control loop in an initial stage where both of the pump modules 33 and 34 are switched from OFF to ON, and separates the low pass filters 33C and 34C from the control loop by turning the by pass switches 33d and 34d ON after a predetermined time period.

The operation of this optical amplifier will now be described. In the initial state, the gain is made constant by the first pump module 33. The second pump module 34 in an OFF state is connected to an output of the feedback loop thereof. Under such a state, the second pump module 34 is switched from OFF to ON. If a low-pass filter 34c was not provided, the control signal would abruptly be applied to the pump light source 34b in step form, and the output pump light from the second pump module 34 would include frequency components higher than the control band of the feedback loop. Moreover, the pump light might include a transient response component, spike, which would temporarily incapacitate the maintenance of the optical amplifier gain at a constant level.

However, in the embodiment shown in FIG. 17, when the pump module 34 is switched from OFF to ON for example, the control signal output from the comparator 20, used to drive pump light source 34b, is supplied to the drive circuit 34a via the low pass filter 34c. Therefore, frequency components higher than the control band of the feedback loop are not included in the output pump light. Further, since the frequency band of the drive current is restricted, the transient response, spike, does not occur. Accordingly, the optical amplifier gain is made constant by the pump module 33, which is already connected to the feedback loop, and the pump module 34, which just became operable. Since the low pass filter 34C is separated from the pump module 34 after a predetermined time period when the control system assumes a steady state, it is possible to enable both pump modules 33 and 34 to operate equally in a given control band. Moreover, as the low pass filter 34C is separated only when the steady state is established, the control system would not be disturbed to the extent where control of the system is impossible. A stated in the foregoing, a new pump module may be incorporated in the gain control system in operation without even slightly varying the gain of the optical amplifier; therefore, construction of an optical amplifier having a pump light source in cold standby becomes possible, greatly enhancing reliability.

Figure 18:
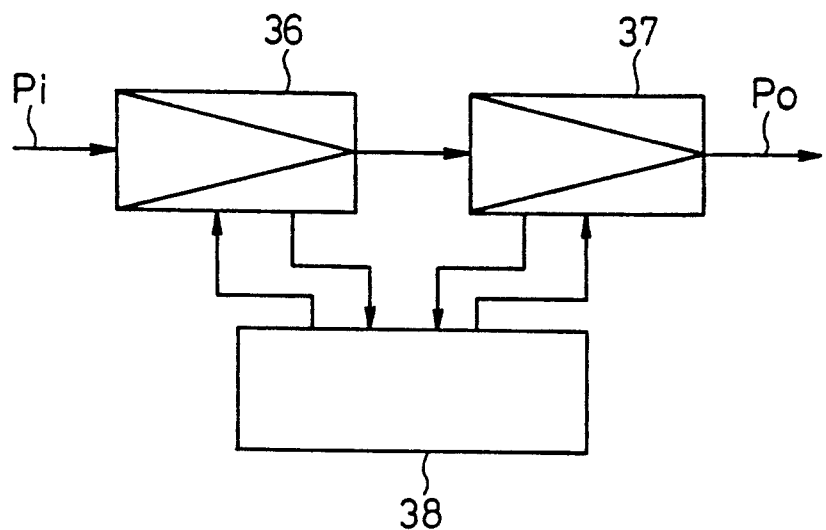

FIG. 18 shows the eighteenth embodiment of this invention wherein plural optical amplifier units 3 and 37 are connected in cascade; and when any of the optical amplifier units 36 and 37 fails to achieve the reference gain, the gain distribution between the optical amplifier units 36 and 37 is controlled by a monitor control unit 38 so that the net gain remains constant. The optical amplifier units 36 and 37 may be any one of the optical amplifier embodiments described above. With this embodiment, when a required optical amplifier gain is not obtained, even when the pump light sources of the optical amplifier unit 37 of the latter stage are controlled, the pump light sources of the optical amplifier unit 36 in the former stage can be controlled to increase the gain of optical amplifier unit 36 making the net gain constant. This optical amplifier can restore a system from a failure even when the number of available pump light sources is limited, thereby greatly enhancing reliability.

Figure 20:
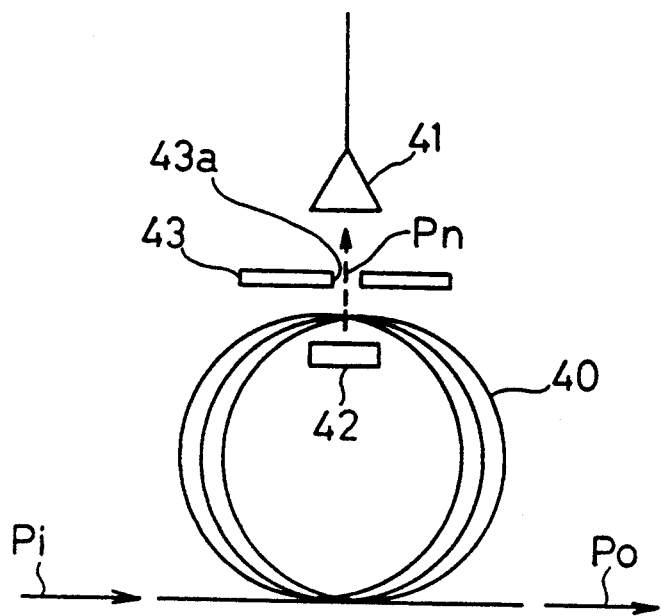
FIG. 20 is a view showing the experimental structure of an optical amplifier according to the present invention.
Figure 21:
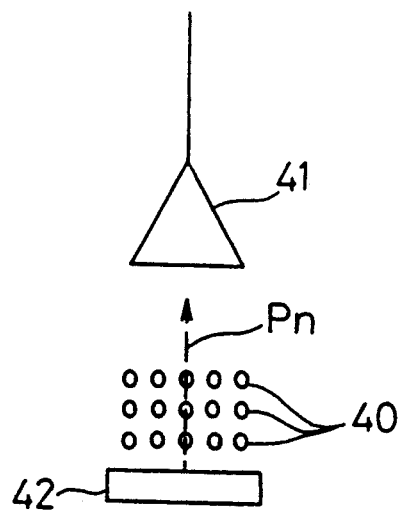
FIG. 21 is an enlarged side view to show the essential parts of the optical amplifier shown in FIG. 20

Experiments were conducted in order to evaluate the present invention by using an optical amplifier according to the embodiment shown in FIGS. 20 and 21. An optical fiber 40 doped with erbium (Er) as a rare-earth atom was wound in a coil of a diameter of 100 mm. The optical fiber 40 was applied with a UV coating to facilitate detection of the spontaneous emission from the sides thereof. The length of the optical fiber 40 was set at 25 m, and the erbium doping level was set at 1000 ppm. In order to detect spontaneous emission, a photodetector of diameter 4 mm and a mirror 42 were placed at opposing positions across a part of the coil of the optical fiber 40, and the spontaneous emission was detected through a slit 43a of a light blocking plate 43. The spontaneous emission from the coiled optical fiber 40 was sampled across a distance interval of about 310 mm. A 1.48 μm laser diode (not shown) was used to pump the optical fiber 40.

Figure 22:
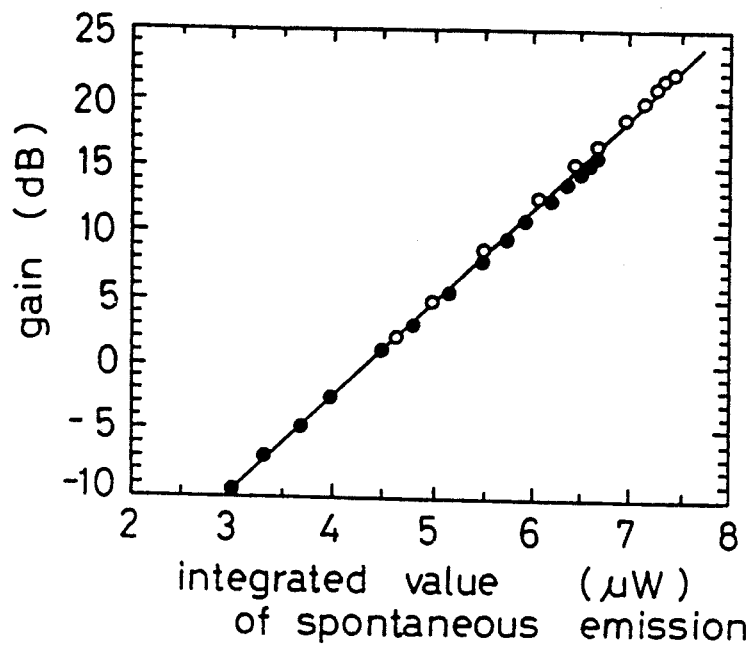
FIG. 22 is a graph showing the relationship between the gain and the integrated value of the spontaneous emission.

FIG. 22 shows the basic data confirming the validity of equation (3) on which the present invention is based. The graph shows the relationship between the gain of the optical amplifier and the integrated spontaneous emission at various input signal powers. In the graph, the open circles denote the values obtained at the input signal power of $-23.8$ dBm, and the solid circles denote those values obtained at the input power of $-9.2$ dBm. The graph clearly indicates that spontaneous emission is superior as a means for measuring optical amplifier gain and that the method of the present invention for integrating spontaneous emission works effectively.

Figure 23:
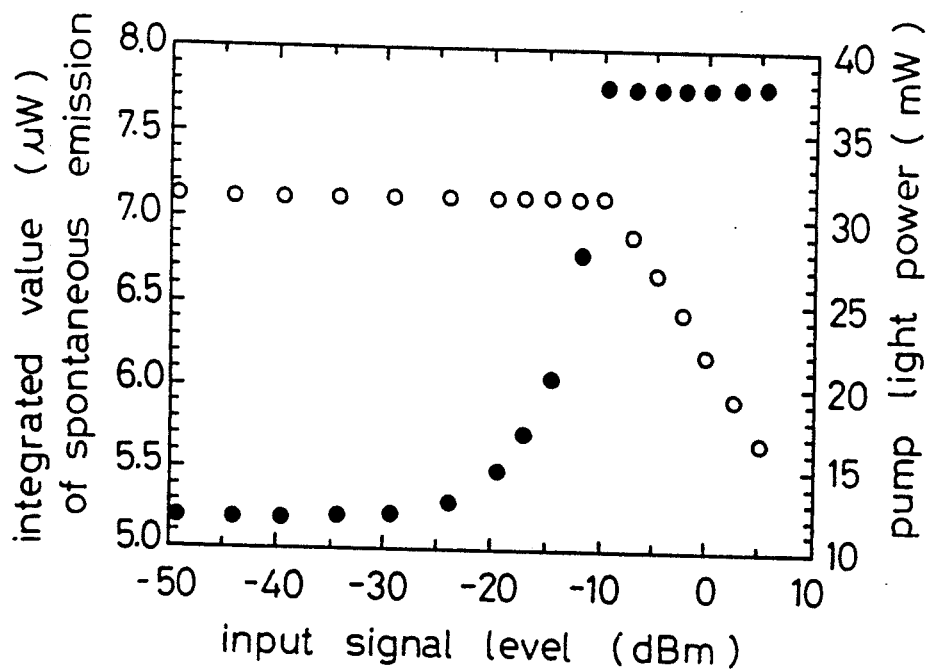
FIG. 23 is a graph showing the relationship between the integrated value of the spontaneous emission and the input optical signal level, and the relationship between the optical pumping power and input optical signal level.

FIG. 23 is a graph showing the relationship between integrated spontaneous emission and the input signal power (open circles), and the relationship between the pump light power and input signal power of the optical amplifier (solid circles) when the optical amplifier gain is controlled to be constant.

Figure 24:
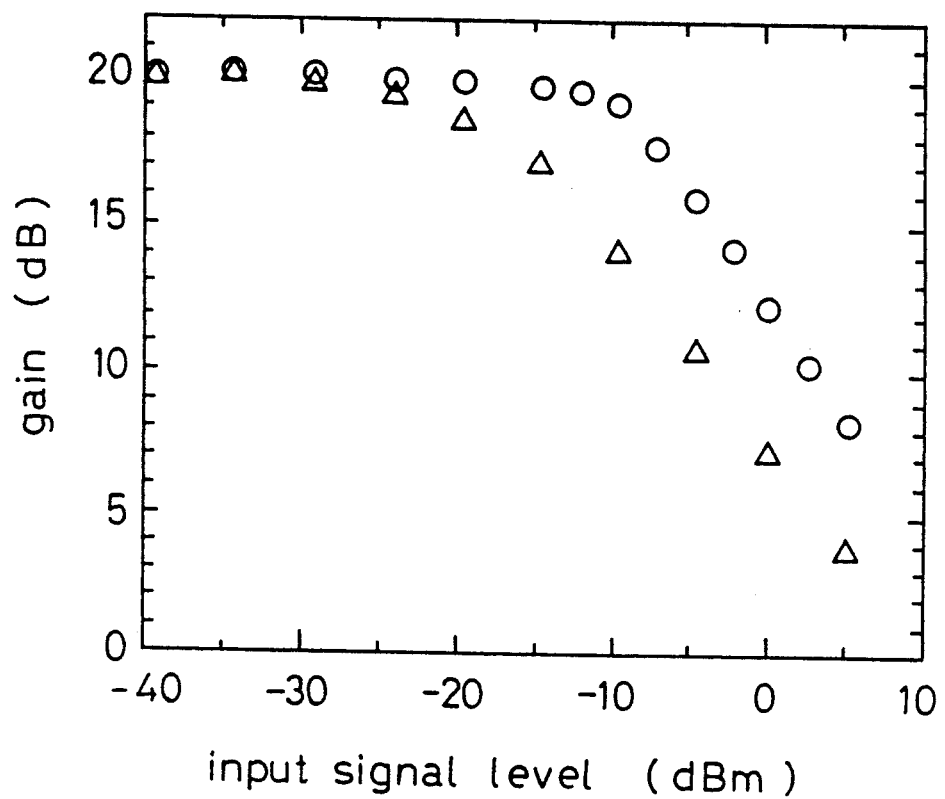
FIG. 24 is a graph showing the relationship between the gain and the input optical signal level.

FIG. 24 is a graph showing the relationship between the gain and the input signal power of an optical amplifier when the gain is controlled to be constant (AGC (Amplifier Gain Control) ON) (expressed by open circles in the graph) and when the gain is not controlled to be constant (AGC OFF) (by open triangles). The integrated spontaneous emission can be maintained constant by feedback control of the pump light power up to the point when the input signal power becomes $-10$ dBm.

The pump light power increased from 12 mW (input signal level of −50 dBm) to 38 mW (input signal level of −10 dBm). Since the maximum power of the pump light is limited to 38 mW, the integrated spontaneous emission can be seen to decreases from the point where the input signal level exceeds −10 dBm.

The 1 dB gain compression input signal power for the 20 dB small signal gain EDFA (Erbium-Doped Fiber Amplifier) is −22 dBm without AGC, and −9 dBm with AGC. Therefore, the scope of the linear operation of the optical amplifier may be increased by about 13 dB by switching the AGC ON.

Figure 25:
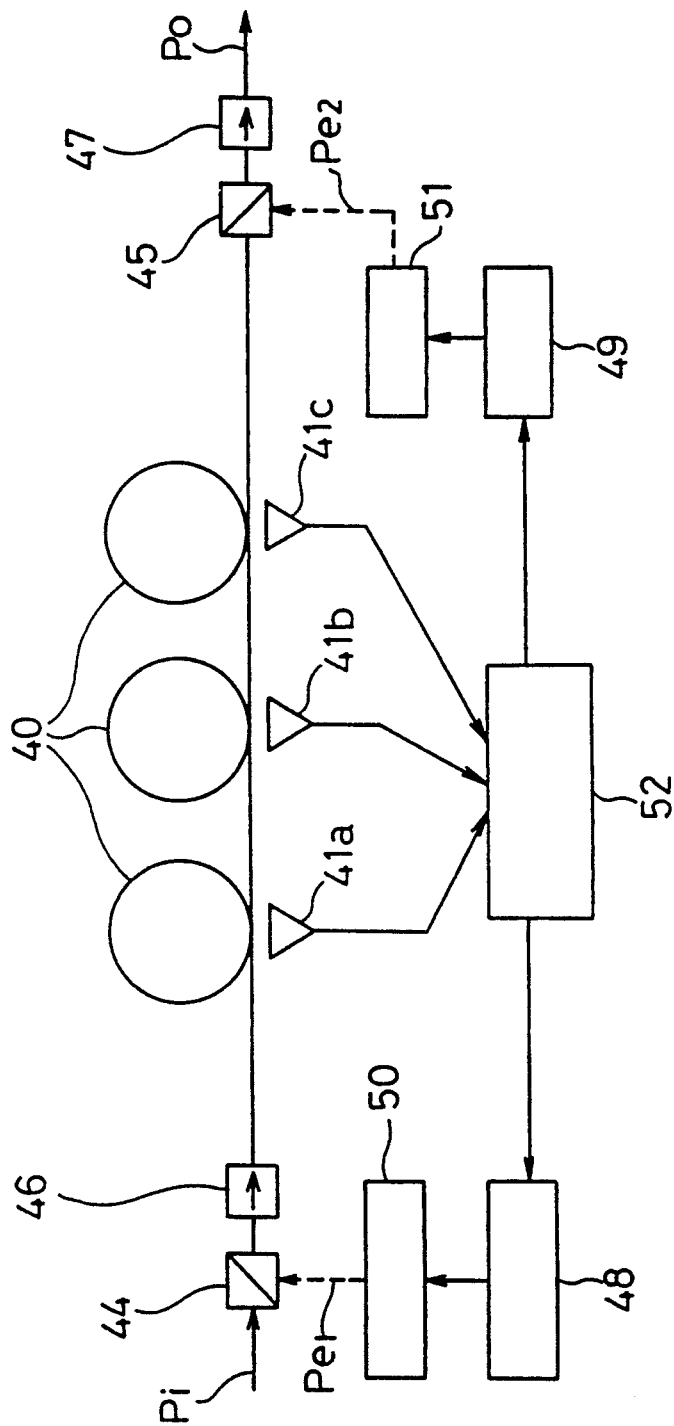
FIG. 25 is a view showing another embodiment of the present invention.

FIG. 25 shows another embodiment of this invention wherein the reference numeral 40 denotes rare-earth doped optical fiber, 41a, 41b and 41c denote photodetectors, 44 and 45 denote couplers, 46 and 47 denote isolators, 48 and 49 denote drive circuits, 50 and 51 denote pump light sources, and 52 denotes a control unit. The photodetectors 41a, 41b and 41c are placed at different positions on the side of the rare-earth doped optical fiber 40 to detect spontaneous emission therefrom. A control unit 52 performs calculations using the detected spontaneous emission based on the equations (3) and (4) to obtain the optical amplifier gain and noise figure NF. Control unit 52 also minimizes the noise figure NF at the constant gain by controlling via the drive circuits 48 and 49 the pump light sources 50 and 51 which supply pumping lights to the optical signal input and output side, respectively, of the optical fiber 40 based on the calculations. Even when either one of the light sources 50 and 51 fails, the gain can be made constant through control of the other light source without suspending optical signal transmission; thereby enhance the reliability of the optical amplifier.

Figure 26:
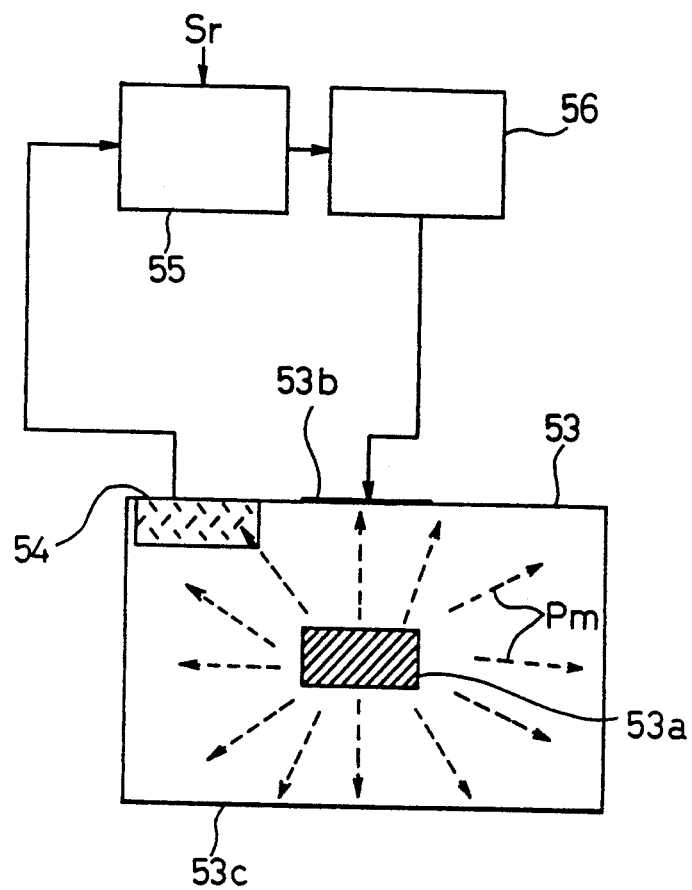
FIG. 26 is a view showing another embodiment of the present invention.
Figure 27:
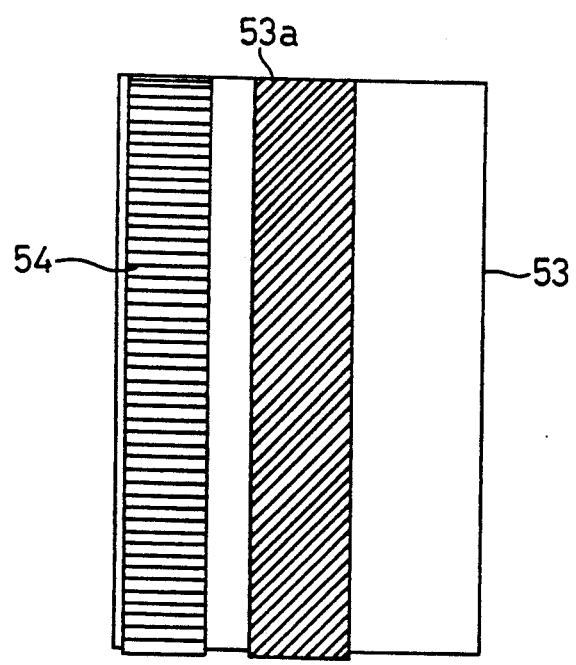
FIG. 27 is a plan view showing the essential parts of FIG. 26.

FIGS. 26 and 27 show another embodiment of this invention. In these figures, the reference numeral 53 denotes a laser diode amplifier having an active layer 53a and electrodes 53b and 53c. A photoconductor 54 receiving spontaneous emission is monolithically integrated in parallel with the active layer 53a. Since the photoconductor 54 has a simple structure, it can easily be integrated. The photoconductor 54 detects spontaneous emission Pn from the laser diode amplifier 53, and the detected values are compared with the reference value Sr by a comparator 55. The amplifier is then controlled by a drive circuit 56 based on the detected values so that the detected values become constant. The output from the photoconductor 54 is proportional to the integrated value of the spontaneous emission from the active layer 53a; therefore, as discussed in previous embodiments control of the laser diode amplifier gain may easily be realized.

Figure 28:
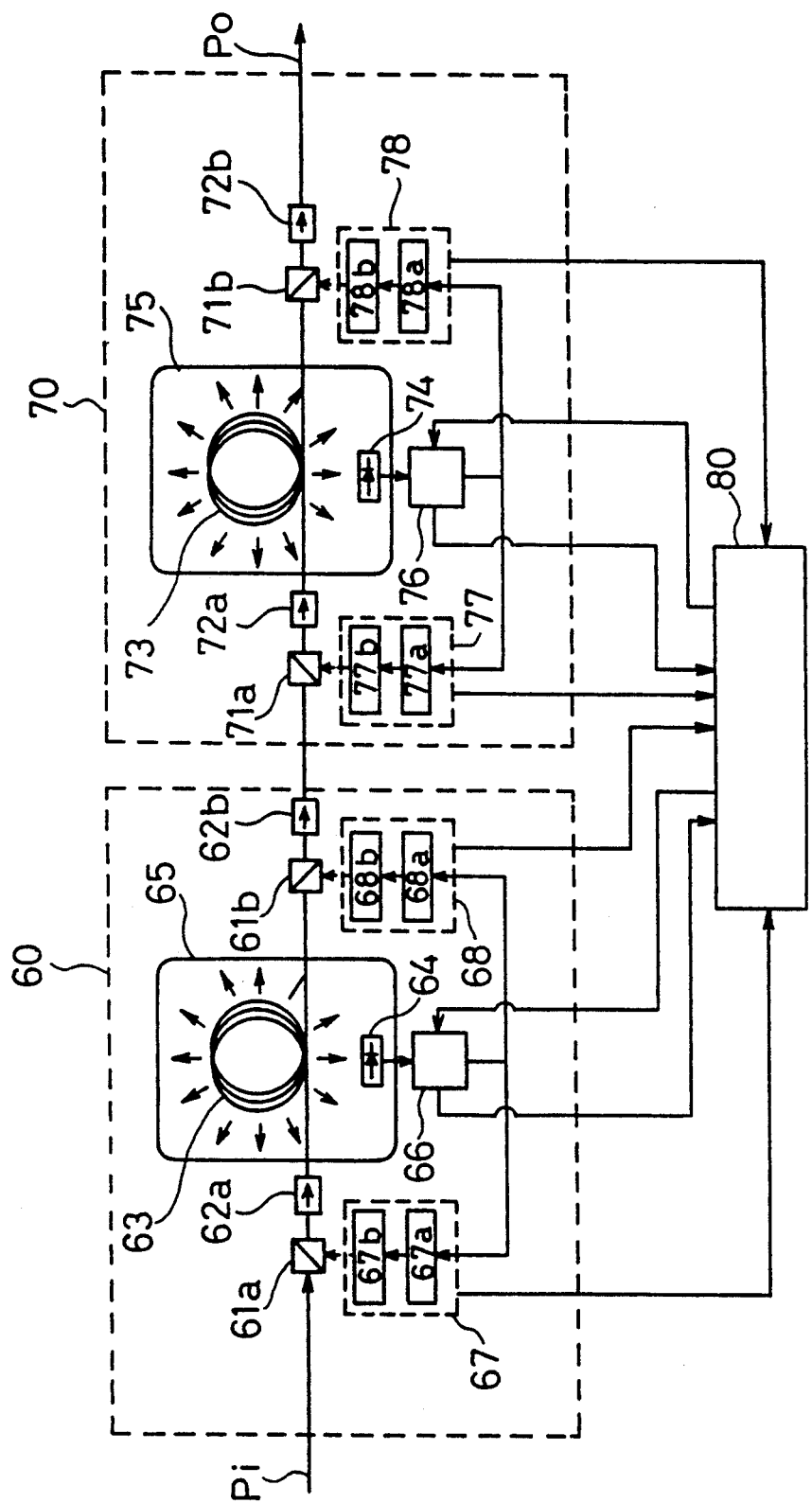
FIG. 28 is a view showing still another embodiment of the present invention.

FIG. 28 shows still another embodiment of this invention wherein the reference numerals 60 and 70 denote optical amplifier units structured in two stages. A monitor control unit 80 is provided for changing the gain distribution between the two optical amplifier units. Both of the optical amplifier units 60 and 70 are rare-earth doped optical fiber amplifiers. The optical amplifier unit 60 includes couplers 61a and 61b, isolators 62a and 62b, a rare-earth doped optical fiber 63, a photodetector 64, an integrating sphere 65, a comparator 66, a pump module 67 integrating a drive circuit 67a and a pump light source 67b, and a pump module 68 integrating a drive circuit 68a and a pump light source 68b. The optical amplifier unit 70 includes couplers 71a and 71b, isolators 72a and 72b, a rare earth doped optical fiber 73, a photodetector 74, an integrating sphere 75, a comparator 76, a pump module 77 integrating a drive circuit 77a and a pump light source 77b, and a pump module 78 integrating a drive circuit 78a and a pump light source 78b. In this embodiment, even if one of or part of the pump light sources fails, AGC may be conducted using the remaining pump light sources to maintain the operation of the optical amplifier without a change in the gain thereof. When a pump light source has failed, the pump light power from the operational pump light sources may be insufficient to maintain the present optical amplifier gain, and the gain decreases. However, the states of the pump light sources of the optical amplifier units 60 and 70 are monitored by the monitor control unit 80. Monitor control unit 80 can set the gain of the optical amplifier unit having an available margin of pump light power at a higher level, and set the gain of the optical amplifier unit not having enough power at a lower level. As a result, the net gain of the optical amplifier may be made constant. Through multiplicity, additional optical amplifiers and/or pump light sources, the gain of the optical amplifier can be maintained, thus preventing transmitted optical signals from being suspended even for an instant. This greatly enhances the reliability of the optical amplifier.

While the invention has been described in connection with what is presently considered the most practical and preferred embodiments, it is to be understood that the invention is not limited to the disclosed embodiments, but on the contrary, is intended to cover various modifications and equivalent arrangements included within the spirit and scope of the appended claims.

We claim:

1. An optical amplifier comprising:
    a rare-earth doped optical fiber;
    at least one pump light source for pumping light into the optical fiber to excite the rare-earth dopant which amplifies an optical signal incident on the optical fiber;
    a detecting means for detecting spontaneous emission from sides of the optical fiber; and
    a feedback means for controlling the pump light source so that the detected spontaneous emission becomes substantially constant.

2. The optical amplifier as claimed in claim 1, wherein the detecting means includes:
    an integrating sphere surrounding the optical fiber; and
    a photodetector placed within the integrating sphere.

3. The optical amplifier as claimed in claim 1, wherein the optical fiber is wound in a coil; and
    the detecting means includes a photodetector arranged beside the coiled optical fiber.

4. The optical amplifier as claimed in claim 1, wherein the optical fiber is circumferentially arranged around the detecting means.

5. The optical amplifier as claimed in claim 1, wherein the detecting means includes plural photodetectors placed along a length of the optical fiber; and
    the feedback means includes a means for processing the output from the plural photodetectors by predetermined operations and for controlling the pump light source so that the processed photodetector output becomes constant.

6. The optical amplifier as claimed in any of claims 1 to 5, wherein an optical band pass filter is provided between the detecting means and the optical fiber for selectively transmitting light having a wavelength within an optical band of an optical signal being transmitted by the optical fiber.

7. The optical amplifier as claimed in any one of claims 3 or 5 wherein a mirror is provided at a position opposing the detecting means across the optical fiber.

8. The optical amplifier as claimed in any one of the claims 1 to 5, wherein an optical system is provided on a detecting surface of the detecting means to compensate for a sensitivity dependence of the detecting means on an incidence angle of light incident upon the detecting surface.

9. The optical amplifier as claimed in claim 1, further comprising:
   a means for detecting optical power of optical signals output from the optical fiber;
   a means for integrating the detected optical power over a time period, which is longer than a time constant $\tau_s$ based on the statistical characteristics of optical signals being transmitted by the optical fiber; and
   a means for controlling the pump light source based on output from the integrating means so that an average power of the output optical signal becomes substantially constant.

10. The optical amplifier as claimed in claim 9, wherein the control means includes a comparator for comparing the average optical power to a reference average optical power; and the control means controlling the pump light source based on a result of the comparison.

11. The optical amplifier as claimed in claim further comprising:
   a means for extracting information on pump light power from the feedback means;
   a first computing means for calculating an optical power of an optical signal output from the optical fiber based on the extracted information;
   a second computing means for integrating the calculated optical power over a time period, which is longer than a time constant $\tau_s$ based on the statistical characteristics of optical signals being transmitted by the optical amplifier, to obtain an average optical power of the output optical signals; and
   a means for controlling the pump light source so that the average optical power substantially coincides with a predetermined reference value.

12. The optical amplifier as claimed in claim 11, wherein the control means includes a comparator for comparing the average optical power to a reference average optical power; and the control means controlling the pump light source based on a result of the comparison.

13. The optical amplifier as claimed in claim 1, further comprising:
   a reference control means which inputs a reference gain and a reference wavelength, calculates a reference spontaneous emission therefrom, and outputs the reference spontaneous emission to the feedback means; and wherein
   the feedback means generates a driving value for driving the pump light source so that the detected spontaneous emission substantially equals the reference spontaneous emission, and
   the reference control means monitors the driving value and generates an alarm when the driving value exceeds an operating limit of the pump light source.

14. The optical amplifier as claimed in claim 1, further comprising:
   a temperature sensor provided near the optical fiber;
   a means for compensating for temperature characteristics of the detected spontaneous emission and of loss in optical signal wavelength in the optical fiber based on the detected temperature;
   first calculating means for computing a gain of the optical amplifier based on output from the means for compensating; and
   a means for controlling the pump light source based on the computed gain so that the computed gain becomes constant.

15. The optical amplifier as claimed in claim 1, further comprising:
   plural pump light sources;
   plural drive circuits included in the feedback means each corresponding to a pump light source; and
   a circuit included in each of the drive circuits for offsetting differences in characteristics between the pump light sources.

16. The optical amplifier as claimed in claim 15, wherein each pump light source and corresponding drive circuit are integrated into a pump module.

17. The optical amplifier as claimed in claim 16, further comprising:
   low pass filters provided at an input of each pump module and having a pass band narrower than a control band of the feedback means;
   a means for independently activating and de-activating operation of each pump module; and
   means for inserting a low pass filter at an input of a pump module which is being activated and for removing the low pass filter therefrom after a predetermined time period from the activation of the pump module.

18. An optical amplifier comprising:
   a rare-earth doped optical fiber;
   plural pump light sources for pumping light into the optical fiber to excite the rare-earth dopant which amplifies an optical signal incident of the optical fiber;
   a detecting means for detecting spontaneous emission from sides of the optical fiber, the detecting means including at least one photodetector corresponding to each pump light source; and
   a feedback means having a feedback loop corresponding to each pump light source, each feedback loop controlling a corresponding pump light source to produce a different optical amplifier gain.

19. The optical amplifier as claimed in claim 18, further comprising a monitor control unit for monitoring each feedback loop, for setting an optical amplifier gain to be produced by each feedback loop, and for independently activating and de-activating operation of each feedback loop.

20. An optical amplifier system having two units of optical, amplifiers as claimed in any one of the claims 1 to 5 or 9 to 19 connected in cascade, a gain distribution between the two optical amplifier units being set so that a gain of a former stage optical amplifier unit is higher than that of a latter stage optical amplifier unit.

21. An optical amplifier system comprising plural units of optical amplifiers as claimed in any one of the claims 1 to 5 or 9 to 19 connected in cascade, and a gain distribution among the plural optical amplifier units being controlled so that the optical amplifier system gain remains constant even when any of the plural optical amplifier units fail.

22. An optical amplifier comprising: a laser diode amplifier which is pumped with electric current to amplify an optical signal incident thereon;
   a drive circuit for supplying pump current to the laser diode amplifier;
   a detecting means for detecting a value corresponding to a total amount of spontaneous emission from a side of the laser diode amplifier;
   a feedback means for controlling the drive circuit output from the drive circuit so that the detected value becomes substantially constant;
   a temperature sensor placed near the laser diode amplifier;
   a means for compensating for temperature characteristics of the detected spontaneous emission and of loss in optical signal wavelength in the laser diode amplifier based on the detected temperature;
   first calculating means for computing a gain of the laser diode amplifier based on output from the means for compensating; and
   a means for controlling the drive circuit based on the computed gain so that the computed gain becomes constant.

23. An optical amplifier system comprising plural units of optical amplifiers as claimed in claim 22 connected in cascade, and a gain distribution among the plural optical amplifier units being controlled so that the optical amplifier system gain remains constant even when any of the plural optical amplifier units fail.

24. The optical amplifier as claimed in any one of claims 1-5, wherein an optical band pass filter is provided between the detecting means and the optical fiber for selectively transmitting light having wavelength within an optical band of an optical signal being transmitted by the optical fiber, and
   wherein a mirror is provided at a position opposing the detecting means across the optical fiber.

* * * * *